United States Patent [19]

Kuo

[11] Patent Number: 5,557,223
[45] Date of Patent: Sep. 17, 1996

[54] CMOS BUS AND TRANSMISSION LINE DRIVER HAVING COMPENSATED EDGE RATE CONTROL

[75] Inventor: James R. Kuo, Cupertino, Calif.

[73] Assignee: National Semiconductor Corporation, Santa Clara, Calif.

[21] Appl. No.: 459,008

[22] Filed: Jun. 2, 1995

Related U.S. Application Data

[63] Continuation of Ser. No. 73,304, Jun. 8, 1993, abandoned.

[51] Int. Cl.$^6$ ............................. H03K 3/00; H03K 17/16; H03K 17/687
[52] U.S. Cl. ............................ 327/108; 327/110; 327/378; 327/379; 327/389; 327/391; 327/427; 326/21; 326/30
[58] Field of Search ....................................... 307/270, 443, 307/451, 310, 591, 246, 571, 572, 573, 585; 327/108, 110, 379, 387, 391, 512, 513, 378, 262, 389, 427; 323/312, 313, 314, 315; 326/21, 23, 24, 30

[56] References Cited

U.S. PATENT DOCUMENTS

| 3,333,113 | 7/1967 | Cole et al. | 307/88.5 |
|---|---|---|---|
| 4,254,501 | 3/1981 | Griffith et al. | 375/9 |
| 4,385,394 | 5/1983 | Pace | 375/36 |

(List continued on next page.)

FOREIGN PATENT DOCUMENTS

| 0199374 | 10/1986 | European Pat. Off. | H03K 19/094 |
|---|---|---|---|
| 0351820A2 | 1/1990 | European Pat. Off. | H03K 19/017 |
| 0504983A1 | 9/1992 | European Pat. Off. | G05F 3/24 |
| 0557080A1 | 8/1993 | European Pat. Off. | H03K 19/003 |
| 0575676A1 | 12/1993 | European Pat. Off. | H03K 19/00 |
| WO85/02507 | 6/1985 | WIPO | H03K 19/092 |
| WO85/04774 | 10/1985 | WIPO | H03K 19/086 |
| WO86/01055 | 2/1986 | WIPO | H03K 19/092 |
| WO89/00362 | 1/1989 | WIPO | H03K 19/094 |
| WO91/20129 | 12/1991 | WIPO | H03K 19/003 |

OTHER PUBLICATIONS

Bill Gunning, "GTL Fact Sheet", Sep. 20, 1991, all pages.
Paul R. Gray and Robert G. Meyer, "Analysis and Design of Analog Integrated Circuits", 1977, pp. 254–261.
"Electronically Switchable Interface Circuit With Multiple EIA Protocol Drivers and Receivers", IBM Technical Disclosure Bulletin, vol. 30, No. 11, Apr. 1988, all pages.
Boris Bertolucci, "Fastbus Dual–Port Memory and Display Diagnostic Module", IEEE Transactions on Nuclear Science, vol. NS–34, No. 1, Feb. 1987, pp. 253–257.
National Semiconductor Corporation, "DS36950 Quad Differential Bus Transceiver", Interface Databook, 1990 Edition, pp. 1–123 to 1–131.
National Semiconductor Corporation, "DS3886 BTL 9–Bit Latching Data Transceiver", High Performance Bus Interface Designer's Guide, 1991 Edition, pp. 1–74 to 1–80.

(List continued on next page.)

Primary Examiner—David C. Nelms
Assistant Examiner—Trong Phan
Attorney, Agent, or Firm—Limbach & Limbach

[57] ABSTRACT

A driver for providing binary signals from a data system to a transmission line is disclosed. A first n-channel transistor has its drain coupled to the transmission line and its source coupled to ground. The channel of the first n-channel transistor has a width that is greater than its length. A first inverter stage conducts current from a first voltage supply to the gate of the first n-channel transistor in order to switch the first n-channel transistor into a conductive state and conducts current from the gate of the first n-channel transistor to ground in order to switch the first n-channel transistor into a non-conductive state. A discharge circuit provides a discharge path from the gate of the first n-channel transistor to ground during a discharge time period and then removes the discharge path at the end of the discharge time period. A temperature compensation circuit may be coupled to the first inverter stage to adjust the level of current conducted to the gate of the first n-channel transistor and the level of current conducted from the gate of the first n-channel transistor to compensate for variations in temperature.

13 Claims, 9 Drawing Sheets

U.S. PATENT DOCUMENTS

| | | | |
|---|---|---|---|
| 4,393,494 | 7/1983 | Belforte et al. | 370/27 |
| 4,419,594 | 12/1983 | Gemmell et al. | 327/538 |
| 4,588,941 | 5/1986 | Kerth et al. | 323/314 |
| 4,645,948 | 2/1987 | Morris et al. | 327/538 |
| 4,647,912 | 3/1987 | Bates et al. | 340/825.5 |
| 4,723,108 | 2/1988 | Murphy et al. | 323/315 |
| 4,751,404 | 6/1988 | Yuen | 327/538 |
| 4,760,292 | 7/1988 | Bach | 307/443 |
| 4,763,021 | 8/1988 | Stickel | 327/581 |
| 4,774,422 | 9/1988 | Donaldson et al. | 326/87 |
| 4,825,402 | 4/1989 | Jalali | 364/900 |
| 4,855,622 | 8/1989 | Johnson | 326/87 |
| 4,855,623 | 8/1989 | Flaherty | 326/87 |
| 4,894,561 | 1/1990 | Nogami | 326/108 |
| 4,922,140 | 5/1990 | Gahle et al. | 326/108 |
| 4,929,941 | 5/1990 | Lecocq | 340/825.14 |
| 4,972,106 | 11/1990 | Ruijs | 326/87 |
| 4,978,905 | 12/1990 | Hoff et al. | 323/314 |
| 4,980,579 | 12/1990 | McDonald et al. | 326/87 |
| 5,015,888 | 5/1991 | Ovens | 326/87 |
| 5,017,813 | 5/1991 | Galbraith et al. | 326/87 |
| 5,019,728 | 5/1991 | Sanwo et al. | 326/87 |
| 5,021,684 | 6/1991 | Ahuja et al. | 327/541 |
| 5,021,691 | 6/1991 | Saito | 326/87 |
| 5,023,487 | 6/1991 | Wellheuser et al. | 326/87 |
| 5,023,488 | 6/1991 | Gunning | 326/87 |
| 5,034,632 | 7/1991 | Jansson et al. | 326/87 |
| 5,041,743 | 8/1991 | Matsumoto | 326/87 |
| 5,070,256 | 12/1991 | Grondalski | 307/270 |
| 5,079,456 | 1/1992 | Kotowski et al. | 327/538 |
| 5,081,380 | 1/1992 | Chen | 307/591 |
| 5,095,231 | 3/1992 | Sartori et al. | 307/270 |
| 5,117,130 | 5/1992 | Shoji | 327/192 |
| 5,118,971 | 6/1992 | Schenck | 326/108 |
| 5,165,046 | 11/1992 | Hesson | 307/270 |
| 5,198,701 | 3/1993 | Davies et al. | 327/513 |
| 5,200,654 | 4/1993 | Archer | 327/362 |
| 5,208,492 | 5/1993 | Masumoto et al. | 326/87 |
| 5,216,292 | 6/1993 | Imazu et al. | 326/86 |
| 5,218,239 | 6/1993 | Boomer | 327/394 |
| 5,231,315 | 7/1993 | Thelen, Jr. | 327/103 |
| 5,241,221 | 8/1993 | Fletcher et al. | 307/443 |
| 5,254,883 | 10/1993 | Horowitz et al. | 327/108 |
| 5,285,116 | 2/1994 | Thaik | 327/170 |
| 5,291,071 | 3/1994 | Allen et al. | 307/270 |
| 5,293,082 | 3/1994 | Bathaee | 307/270 |
| 5,296,756 | 3/1994 | Patel et al. | 307/443 |
| 5,304,861 | 4/1994 | Fruhauf et al. | 327/514 |
| 5,313,118 | 5/1994 | Lundberg | 307/270 |
| 5,315,174 | 5/1994 | Chang et al. | 327/384 |
| 5,319,258 | 6/1994 | Ruetz | 327/108 |
| 5,329,184 | 7/1994 | Redfern | 307/270 |
| 5,334,882 | 8/1994 | Ting | 307/270 |
| 5,338,987 | 8/1994 | Tomasetti et al. | 327/108 |

OTHER PUBLICATIONS

National Semiconductor Corporation, "DS3883 BTL 9–Bit Data Transceiver", High Performance Bus Interface Designer's Guide, 1991 Edition, pp. 1–58 to 1–62.

U.S. application Ser. No. 08/073,939 issued to James R. Kuo, filed Jun. 8, 1993.

U.S. application Ser. No. 08/073,534 issued to James R. Kuo, filed Jun. 8, 1993.

U.S. application Ser. No. 08/073,679 issued to James R. Kuo, filed Jun. 8, 1993.

U.S. application Ser. No. 08/073,927 issued to James R. Kuo, filed Jun. 8, 1993.

U.S. application Ser. No. 08/146,617 issued to James R. Kuo, filed Nov. 2, 1993.

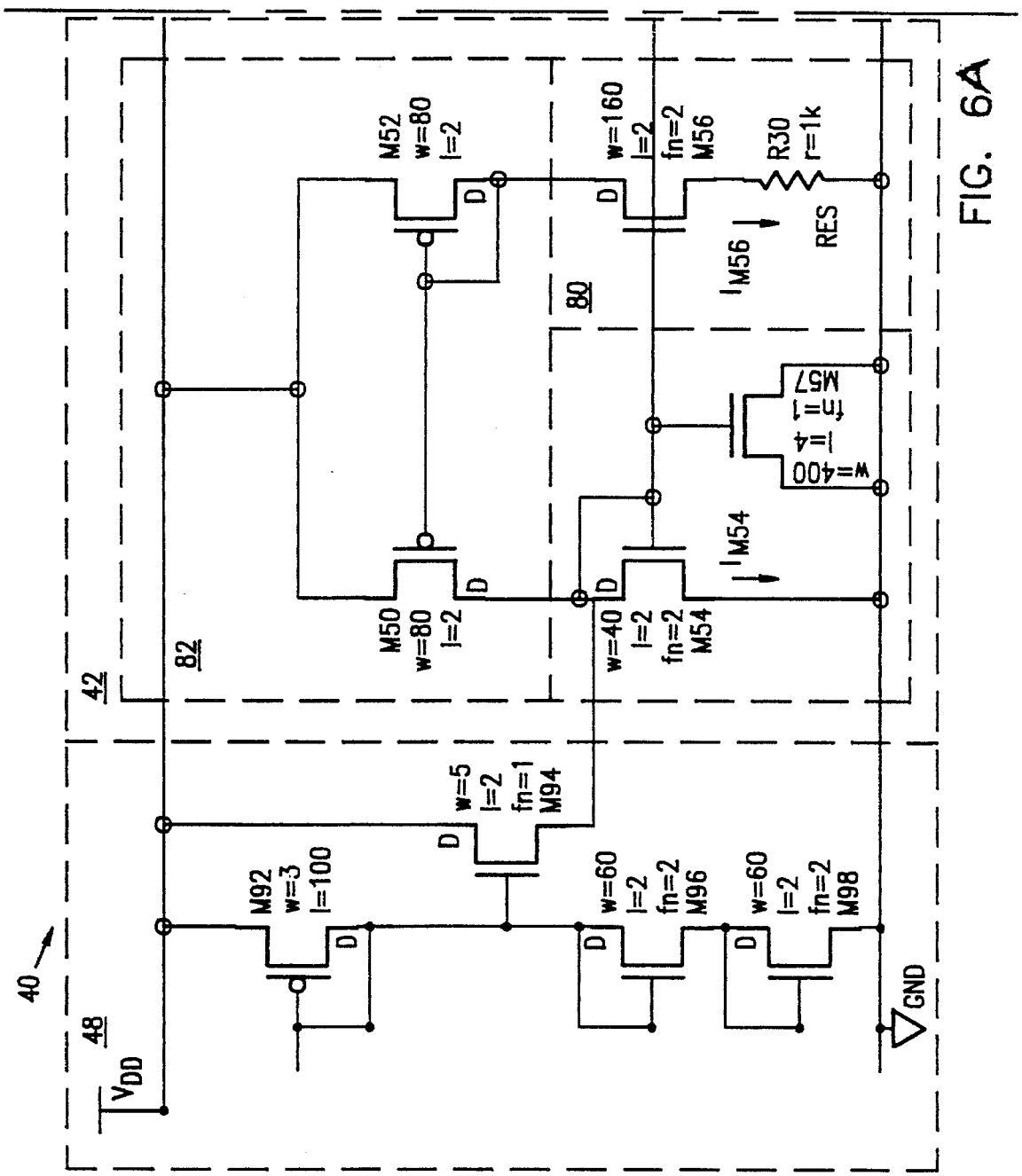
FIG. 6A
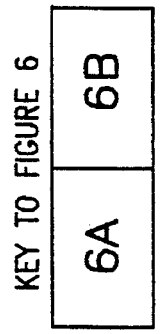
| KEY TO FIGURE 6 | |
|---|---|
| 6A | 6B |

| $c_1$ | $c_2$ | $V_{GM70}$ | $V_{GM72}$ | $V_{GM74}$ | $V_{GM76}$ |
|---|---|---|---|---|---|
| 0 | 0 | 0 | 0 | 0 | 1 |
| 0 | 1 | 0 | 0 | 1 | 0 |
| 1 | 0 | 0 | 1 | 0 | 0 |
| 1 | 1 | 1 | 0 | 0 | 0 |

CMOS BUS AND TRANSMISSION LINE DRIVER HAVING COMPENSATED EDGE RATE CONTROL

This is a continuation of application Ser. No. 08/073,304 filed on Jun. 8, 1993 now abandoned.

RELATED APPLICATIONS

This application is related to the following copending applications that were all filed of even date herewith and are commonly assigned with this application to National Semiconductor Corporation of Santa Clara, Calif.: U.S. Ser. No. 08/073,939 titled "Programmable CMOS Current Source Having Positive Temperature Coefficient" by James Kuo; U.S. Ser. No. 08/073,534 titled "CMOS BTL Compatible Bus and Transmission Line Driver" by James Kuo; U.S. Ser. No. 08/073,534 titled "Programmable Slew Rate CMOS Buffer and Transmission Line Driver with Temperature Compensation" by James Kuo; and, U.S. Ser. No. 08/073,927 titled "Programmable CMOS Bus and Transmission Line Receiver" by James Kuo. The above-referenced applications are hereby incorporated by reference to provide background information regarding the present invention.

BACKGROUND OF THE INVENTION

1. Field of the Invention

The present invention relates to line interface devices, and, in particular, to a CMOS transmission line driver that is used for interfacing CMOS digital circuits to transmission lines.

2. Description of the Related Art

Digital systems typically include several Very Large Scale Integrated (VLSI) circuits that cooperate and communicate with one-another to perform a desired task. FIG. 1 illustrates a typical digital system. The VLSI circuits are mounted on several circuit boards that are referred to as "daughter boards". Each daughter board may accommodate several VLSI circuits. In turn, the daughter boards are received by a "mother board" that has circuitry for facilitating communication between the individual daughter boards.

The individual VLSI circuits are interconnected for binary communication by transmission mediums. The transmission mediums are generally collected together to form buses. The number, size and types of buses that are used in a digital system may be designed for general-purpose applications or according to a more specific, industry standard data-communications configuration. One such industry standard is the so-called IEEE 896.1 Futurebus+ standard. The Futurebus+ standard provides a protocol for implementing an internal computer bus architecture.

FIG. 1 illustrates the hierarchy of the several different bus levels utilizable in a Futurebus+ system. A "component level bus" is used to interconnect the several VLSI circuits that are located on a single daughter board, and a "backplane bus" is used to interconnect the VLSI circuits of one daughter board to the VLSI circuits of another daughter board. Thus, a component level bus is constructed on each daughter board, and a backplane bus is constructed on the mother board.

The transmission mediums which form the component and backplane buses are typically traces which are formed on the printed circuit board (PCB) substrates of the daughter and mother boards. Microstrip traces and strip line traces can be employed to form transmission lines having characteristic impedances on the order of about 50Ω–70Ω. Such transmission lines usually have their opposite ends terminated in their characteristic impedance. Because of the parallel resistive terminations, the effective resistance of the transmission line may be as low as 25Ω–35Ω.

Data transceivers (TRANSmitter/reCEIVER) are used to interface the VLSI circuits to the transmission medium. FIG. 2 illustrates the positioning of a data transceiver between the backplane bus of a Futurebus+ system and the data bus of a VLSI circuit to facilitate communications between the VLSI circuit and the rest of the digital system.

A data transceiver is a read/write terminal capable of transmitting information to and receiving information from the transmission medium. A transceiver typically includes a line driver stage (or simply "driver") and a receiver stage (or simply "receiver"). The common purpose of transmission line drivers and receivers is to transmit data quickly and reliably through a variety of environments over electrically long distances. This task is complicated by the fact that externally introduced noise and ground shifts can severely degrade the data.

Drivers amplify digital signal outputs from the VLSI circuitry so that the signals can be properly transmitted on the transmission medium. Receivers are typically differential amplifiers that receive signals from the transmission medium and provide outputs to the VLSI circuitry that are representative of digital information received from the medium.

Conventional drivers usually include level shifting capability to provide compatibility with different integrated circuit technologies. Specifically, before a driver transmits a signal across a transmission medium, the driver changes the nominal voltage swing (or the "dynamic signal range") utilized by the VLSI circuitry, e.g., CMOS, TTL, ECL, etc., to a different voltage swing that is utilized by the transmission medium. Thus, a driver not only amplifies a digital signal, but it changes the nominal voltage swing of the signal as well.

CMOS technology is attractive for implementing VLSI circuits with high density and with much lower power dissipation than its bipolar counterpart. However, standard TTL or CMOS circuits operate between 5 Volts and ground which causes them to dissipate excessive amounts of power when driving terminated transmission lines. ECL has been used for many years to drive terminated transmission lines; however, ECL has relatively high power dissipation.

A different nominal voltage swing is normally used when transmitting data across a transmission medium in order to conserve power. Specifically, the power internally dissipated by the driver is proportional to the nominal voltage swing of the binary signal it applies to the transmission line. Therefore, power dissipation is reduced if the driver transmits a signal having a relatively small voltage swing over the transmission line.

It has become common for signals to be transmitted over transmission lines at BTL (Backplane Transceiver Logic) signal levels. The signal level standard is denoted "Backplane" because BTL has been used primarily in the backplane buses of mother boards. Because the nominal voltage swing of BTL is 1.0 Volt (logic low) to 2.1 Volts (logic high), power dissipation is less than it would be if the signals were transmitted over the transmission lines at CMOS (0 Volts to 3.3 Volts, or, 0 Volts to 5 Volts) or TTL (0 volts to 3.5 Volts) signal levels.

Signals have also been transmitted over transmission lines at the so-called "GTL" signal levels disclosed in U.S. Pat. No. 5,023,488 to Gunning ("Gunning"). Gunning discloses such GTL drivers and receivers for interfacing VLSI CMOS circuits to transmission lines. The nominal voltage swing of GTL is 0.3 Volts (logic low) to 1.2 Volts (logic high).

FIG. 3 shows the basic GTL driver 10 that is disclosed in Gunning. A very wide channel, open drain, N-channel CMOS transistor M1 is used for transforming binary signals to a transmission line 12 from a more or less conventional CMOS signal source 14 which effectively isolates the transmission line 12 from the ordinary 5 v rail-to-rail signal swing of the signal source 14. Transistor M1 has its gate connected to the output of the signal source 14, its drain connected to the transmission line 12, and its source returned to ground (i.e., the same reference level as the 0 v rail of the signal source 14).

The rate at which the transistor M1 responds to transitions in the binary signal supplied by the signal source 14 is dependent upon the rate at which transistor M1's gate capacitance charges and discharges. Therefore, for higher frequency operations, the output stage of the signal source 14 is an inverter comprising a p-channel transistor M2 and an n-channel transistor M3. Transistors M2 and M3 are connected in a standard inverter configuration. More particularly, they have their gates connected to a signal node $V_{IN}$ within the signal source 14, their drains connected to the gate of the transistor M1, and their sources connected to the 5 v rail and the 0 v rail, respectively, of signal source 14.

In operation, when the signal at $V_{IN}$ drops to a low ("0") logic level, transistors M2 and M3 are switched into and out of conduction, respectively. Thus, the gate capacitance of transistor M1 is charged relatively rapidly by the current conducted by the source-drain circuit of transistor M2. The gate of transistor M1 is quickly pulled up toward the 5 Volt rail of the signal source 14, thereby causing transistor M1 to promptly switch into conduction. On the other hand, when the signal $V_{IN}$ increases to a high ("1") logic level, transistor M2 switches out of conduction while transistor M3 switches into conduction. This causes the gate capacitance of transistor M1 to be quickly discharged by the current conducted by the source-drain circuit of transistor M3 so that the gate of transistor M1 is pulled down relatively rapidly toward the 0 Volt rail of the signal source 14, thereby promptly switching transistor M1 out of conduction.

The signal level on the transmission line 12 tends to stabilize substantially at the voltage level to which the transmission line 12 is terminated a short time after transistor M1 is switched out of conduction (i.e., as soon as the switching transients have settled out). On the other hand, when transistor M1 is switched into conduction, its source-drain circuit provides a ground return path for current flow through the terminating resistors 16 and 18. The signal level at which the transmission line 12 tends to stabilize (again, after the switching transients have settled out) is determined by the voltage division which the parallel terminating resistor 16 and 18 and the source-drain resistance of the conductive transistor M1 perform on the voltage to which the transmission line 12 is terminated.

The effective voltage dividing ratio of the divider is determined to a first approximation by the ratio of the source-drain resistance of transistor M1 in its conductive state to the sum of that resistance plus the effective resistance of the parallel terminating resistors 16 and 18. Thus, for example, if the low ("0") signal level on the transmission line 12 is selected to be approximately 0.3 Volts to provide a signal swing of approximately 1.0 Volts, the channel width of the transistor M1 ordinarily has to be orders of magnitude greater than its channel length to reduce the effective resistance of its source-drain circuit in conduction to a suitably low level. The optimal channel width-to-channel length ratio of transistor M1 depends on several process and application specific variables, but a ratio of about 1000:1 is typical at the current state of the art.

FIG. 4 shows a GTL driver 20 with a damping circuit. Specifically, provision is made in the driver 20 for damping certain of the switching transients which are generated when transistor M1 is switched into and out of conduction. These improvements permit the GTL signal swing to be reduced to a swing of about 0.8 Volts between an upper limit of approximately 1.2 Volts and a lower limit of about 0.4 Volts.

Some of the more troublesome switching transients occur when transistor M1 is switched from a conductive state to a non-conductive state. The drain-side parasitic packaging inductance and the drain-side parasitic capacitances of transistor M1 form a ringing circuit which tends to cause the voltage on the transmission line 12 to overshoot its nominal upper limit by a substantial margin and to oscillate for a prolonged period of time. Similarly, the source-side parasitic inductances and capacitances of transistor M1 form another ringing circuit which tends to cause a potentially troublesome oscillatory "ground bounce" perturbance of the reference voltage on the low level rail of the CMOS circuit.

To reduce these switching transients, the driver 20 is equipped with a feedback circuit for briefly connecting the drain of transistor M1 to its gate when transistor M1 is switched from a conductive state to a non-conductive state. The feedback circuit includes a pair of n-channel transistors M4 and M5 which have their source-drain circuits connected in series between the drain and gate of transistor M1. The input $V_{IN}$ for the driver 20 is coupled to the gate of transistor M5, and two additional inverter stages 22 and 24 are coupled between the inverter 14 and the gate of transistor M4.

During operation, a low ("0") logic level signal at $V_{IN}$ holds transistor M5 in a non-conductive state and transistors M1 and M4 in conductive states. However, shortly after the logic level of the signal at $V_{IN}$ increases to a high ("1") logic level, the p-channel transistor M2 and the n-channel transistor M3 of the asymmetric inverter stage 14 switch out of and into conduction, respectively. Transistor M3 tends to pull the gate of transistor M1 down toward ground, but transistor M5 is now switched into conduction, so it completes a feedback path between the drain and the gate of transistor M1. Transistor M3 is relatively weak (i.e., it has a significantly higher source-drain resistance than the other transistors), so most of the discharge current for the gate capacitance of transistor M1 is drawn through the drain-source circuit of transistor M1 via transistors M4 and M5.

As the gate voltage of transistor M1 drops, its drain voltage increase. However, the feedback path provided by the transistors M4 and M5 precludes the drain voltage of transistor M1 from increasing to a level significantly above its gate voltage. This limits the rate at which the current flowing through the parasitic inductances changes, thereby limiting the rates at which the drain-side capacitances, the source-side capacitances, and the gate-substrate capacitance discharge. Accordingly, the drain-side voltage overshoot and the source-side ground bounce are damped. Finally, about one nanosecond after transistor M5 is switched into conduction, the output of the last inverter stage 24 drops to a low ("0") logic level, so the feedback loop then is re-opened to permit the transistor M1 to switch completely out of conduction.

The GTL driver 20 disclosed in Gunning suffers from a number of disadvantages. First, the feedback circuit that is used to control the rising edge of $V_{OUT}$ prevents the drain voltage of transistor M1 from increasing to a level significantly above its gate voltage. Because the drain voltage is held low, $V_{OUT}$ cannot go high until the feedback circuit is disabled which increases the propagation delay of the driver 20.

A second disadvantage of the driver 20 is that its rise time $t_r$, fall time $t_f$, edge rate, turn-on delay, turn-off delay, and propagation delay are sensitive to temperature variations, supply voltage variations, and process variations.

A third disadvantage of the driver 20 is that its minimum rise time $t_r$ and fall time $t_f$ are too fast which causes ground bouncing, output over-shooting, and large cross-talk.

These disadvantages cause output pulse distortion.

Thus, there is a need for a transmission line driver that provides an output voltage swing of approximately 0.3 Volts (logic low) to 1.2 Volts (logic high) and that overcomes the disadvantages of the GTL drivers discussed above.

SUMMARY OF THE INVENTION

The present invention provides a driver for feeding binary signals from a data system to a transmission line. The driver includes a first n-channel transistor, a first inverter stage, and a discharge circuit. The first n-channel transistor has its drain coupled to the transmission line and its source coupled to ground. The channel of the first n-channel transistor has a width that is greater than its length. The first inverter stage conducts current from a first voltage supply to the gate of the first n-channel transistor in order to switch the first n-channel transistor into a conductive state and conducts current from the gate of the first n-channel transistor to ground in order to switch the first n-channel transistor into a nonconductive state. The discharge circuit provides a discharge path from the gate of the first n-channel transistor to ground during a discharge time period and then removes the discharge path at the end of the discharge time period. The discharge time period begins when the first inverter stage receives a binary signal commanding it to switch the first n-channel transistor from the conductive state to the nonconductive state, and the discharge time period has a length equal to a period of time necessary to decrease the gate-source voltage of the first n-channel transistor to a level just above its threshold voltage.

In an alternative embodiment of the present invention, the driver includes a first n-channel transistor, a first inverter stage, and a temperature compensation circuit. The temperature compensation circuit coupled to the first inverter stage and adjusts the level of current conducted to the gate of the first n-channel transistor and the level of current conducted from the gate of the first n-channel transistor to compensate for variations in temperature.

A better understanding of the features and advantages of the present invention will be obtained by reference to the following detailed description of the invention and accompanying drawings which set forth an illustrative embodiment in which the principles of the invention are utilized.

DETAILED DESCRIPTION OF THE PREFERRED EMBODIMENT

Figure 5:
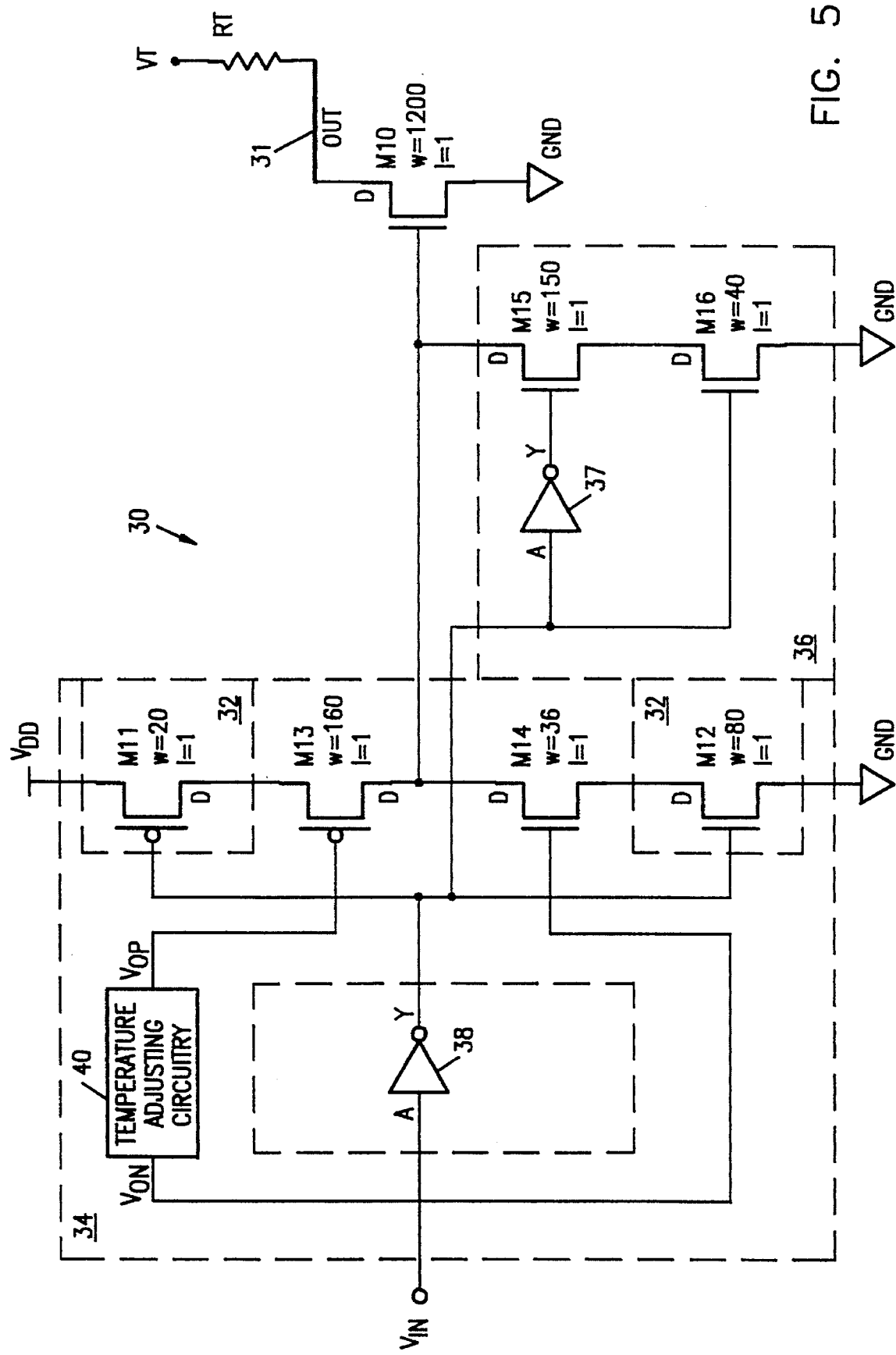
FIG. 5 is a schematic diagram illustrating a CMOS transmission line driver in accordance with the present invention.

FIG. 5 shows a CMOS transmission line driver 30 in accordance with the present invention that has an output voltage swing of approximately 0.3 Volts (logic low) to 1.2 Volts (logic high). Thus, the output of the driver 30 is compatible with the so-called "GTL" standard discussed above. The driver 30's logic low output may be equal to 0.3 Volts ±0.1 Volt and its logic high output may be equal to 1.2 Volts ±5% when supply voltage variations are taken into account.

The driver 30 is a high speed bus driver with unique edge rate control. It has low output pulse distortion and may be operated at a data rate up to 250 MHz. It is capable of carrying out binary communications over a relatively low impedance transmission line 31 which is terminated to voltage levels $V_T$ on the order of about 1.2 Volts. The transmission line 31 is typically a microstrip trace or a strip line trace with a characteristic impedance on the order of about 50Ω–70Ω. Normally, the transmission line 31 has its opposite ends terminated in its characteristic impedance. A resistor $R_T$ symbolizes the effective resistance of the parallel terminating resistors; thus, resistor $R_T$ has a value of approximately 25Ω–35Ω.

The driver 30 includes a very wide channel, open drain, n-channel MOSFET M10. The drain of the transistor M10 is coupled to the transmission line 31 and the source is coupled to ground. The channel width of transistor M10 should be orders of magnitude greater than its channel length to reduce the effective resistance of its drain-source circuit during conduction. Preferably, transistor M10 has a channel width of 1200 μm and a length of 1 μm. Furthermore, although only a single transistor M10 is shown, it is to be understood that it may be fabricated by connecting any number of n-channel transistors in parallel with each other; such parallelism may be used for producing a transistor M10 of the desired effective channel width.

The gate of transistor M10 is coupled to an inverter stage 32. The purpose of the inverter stage 32 is to conduct current from a voltage supply $V_{DD}$ to the gate of transistor M10 in order to switch it into a conductive state and to conduct current from the gate of the transistor M10 to ground in order to switch it into a non-conductive state. The inverter stage 32 includes a p-channel transistor M11 that has its source coupled to the voltage supply $V_{DD}$ and an n-channel transistor M12 that has its source coupled to ground. The gates of transistors M11 and M12 are coupled together and form the input of the inverter stage 32.

The input of the inverter stage 32 and the gate of transistor M10 are coupled to a discharge circuit 36. The purpose of the discharge circuit 36 is to provide a discharge path from the gate of transistor M10 to ground during a discharge time period and then remove the discharge path at the end of the discharge time period. The discharge time period begins when the inverter stage 32 receives a binary signal commanding it to switch transistor M10 from the conductive state to the non-conductive state. The discharge time period has a length equal to a period of time necessary to decrease the gate-source voltage $V_{GS}$ of transistor M10 from approximately the $V_{DD}$ level down to a level just above transistor M10's threshold voltage $V_{TH}$. It has been found herein that a discharge time period equal to one logic gate delay time, specifically, a CMOS inverter delay time, gives good results. As will be discussed in more detail below, the discharge circuit 36 prevents the problems of output voltage overshoot and ground bouncing without increasing the turn-off delay of the circuit.

The discharge circuit 36 includes two n-channel transistors M15 and M16 that have their drain-source circuits connected in series between the gate of transistor M10 and ground to provide a discharge path directly from the gate of transistor M10 to ground. Transistors M15 and M16 are switched into simultaneous conducting states for approximately one logic gate delay time by means of their gate connections and an inverter 37. Specifically, the gate of transistor M15 is coupled to the output of inverter 37, and the input of inverter 37 is coupled to the input of the inverter stage 32. The gate of transistor M16 is coupled to the input of the inverter stage 32. The operation of transistors M15 and M16 will be described in greater detail below.

A temperature compensation circuit 34 is coupled to the inverter stage 32. The purpose of the temperature compensation circuit 34 is to adjust the level of current conducted to the gate of transistor M10 and the level of current conducted from the gate of transistor M10 to compensate for variations in temperature. As will be described in detail below, the temperature compensation circuit 34 causes the driver 30's rise time $t_r$, fall time $t_f$, edge rate, turn-on delay, turn-off delay, and propagation delay to be relatively insensitive to temperature variations, supply voltage $V_{DD}$ variations, and process variations.

The temperature compensation circuit 34 includes a p-channel transistor M13 that has its source coupled to the drain of transistor M11 and its drain coupled to the gate of transistor M10. An n-channel transistor M14 has its source coupled to the drain of transistor M12 and its drain coupled to the gate of transistor M10. The gates of transistors M13 and M14 are coupled to outputs $V_{OP}$ and $V_{ON}$, respectively, of adjusting circuitry 40. The effects of temperature variation on MOSFET transistors, as well as the structure and operation of the temperature compensation circuit 34, will be described in detail below with reference to FIGS. 6 and 7. For the present discussion regarding the basic operation of the driver 30, however, it can be assumed that outputs $V_{OP}$ and $V_{ON}$ maintain a source-gate potential $V_{SG}$ and gate-source potential $V_{GS}$ on transistors M13 and M14 such that they will conduct current whenever transistors M11 and M12 are conducting current, respectively. It should also be noted that transistors M13 and M14 may be positioned between transistors M11 and M12. In other words, the source of transistor M11 may be connected directly to voltage $V_{DD}$ and the source of transistor M13 connected to the drain of transistor M11, and the source of transistor M12 may be connected directly to ground and the source of transistor M14 connected to the drain of transistor M12.

A CMOS inverter 38 is preferably inserted between input VIN and the input of the inverter stage 32. The inverter 38 causes the driver 30 to invert binary signals from input to output. However, the inverter 38 is used primarily as a buffer and its use is optional in the present invention.

In order to describe the operation of the driver 30, it will be assumed that the input $V_{IN}$ initially receives a high or logic "1" level CMOS signal, i.e., $V_{IN}$=3.3 Volts. The output of inverter 38 is low which pulls down the gate of transistor M11 so that both it and transistor M13 conduct current from source to drain. Current is conducted to the gate of transistor M10 so that the gate of transistor M10 is pulled up to $\approx V_{DD}$ causing transistor M10 to be in a conducting state. Because transistor M10 conducts current from drain to source, current flows through the terminating resistor $R_T$. A voltage drop is created across the resistor $R_T$ causing the potential of the transmission line 31, i.e., $V_{OUT}$, to be pulled to a GTL low level, i.e., approximately 0.3 Volts±0.1 Volts.

While transistor M10 is conducting current, the gate of transistor M15 is pulled high because the output of inverter 37 is at a high level. Transistor M15, however, does not conduct current at this point because the gate of transistor M16 is held low by the low output of inverter 38. Furthermore, the gate of transistor M12 is held low so that it and transistor M14 do not conduct current.

When input $V_{IN}$ is switched to a low or logic "0" level CMOS signal, i.e., $V_{IN}$=0 Volts, the output of inverter 38 pulls the gate of transistor M16 high which causes it to conduct current from drain to source. The gate of transistor M15 remains pulled high for approximately one logic gate delay due to the presence of inverter 37. Thus, an instant peak current is produced through transistors M15 and M16 to pull the gate of transistor M10 down quickly from $V_{DD}$ level. After one logic gate delay, the output of inverter 37 goes low causing transistor M15 to stop conducting current. Thus, transistor M16 provides instant discharge current from the gate of transistor M10 until transistor M15 switches off one logic gate delay later. It should be noted that three or five logic gate delays will also provide a sufficient discharge time period.

Meanwhile, the gates of transistors M11 and M12 are pulled high which causes transistors M11 and M13 to stop conducting and transistors M12 and M14 to start conducting. Transistors M12 and M14 provide a constant discharging path from the gate of transistor M10 to ground. The gate of transistor M10 discharges at a rate of:

$$dV_{GSM10}/dt = I_{DSM14}/C_{gM10}$$

where $C_{gM10}$ is the total capacitance at the gate of transistor M10 and $I_{DSN\,14}$ is the current through transistors M12 and M14. Because the gate of transistor M10 is being pulled down to ground, the drain of transistor M10 is linearly rising to the $V_T$ voltage level, i.e., the GTL high level.

When input $V_{IN}$ is switched back to a high or logic "1" level CMOS signal, i.e., VIN=3.3 Volts, the gate of transistor M16 is pulled low and the gate of transistor M15 is pulled high one logic gate delay thereafter. Transistors M15 and M16 do not conduct current because the gate of transistor M16 is held low. Furthermore, the gates of transistors M11 and M12 are pulled low which causes transistors M11 and M13 to start conducting current and transistors M12 and M14 to stop conducting current. Transistor M13 sources a constant current through transistor M11 to charge up the gate of transistor M10 at a rate of:

$$dV_{GSM10}/dt=I_{SDM13}/C_{gM10}$$

where $I_{SDM13}$ is the current conducted by transistors M13 and M11. As soon as the gate-source voltage $V_{GS}$ of transistor M10 reaches its threshold voltage level $V_{TH}$, the drain voltage of transistor M10, i.e., $V_{OUT}$, starts ramping down linearly.

The driver 30 of the present invention has several advantages over the driver 20 discussed above. First, the discharge circuit 36 reduces output over-shoot and ground bounce (when transistor M10 is switched from a conductive state to a non-conductive state) without increasing the driver 30's propagation delay. Propagation delay is not increased because the voltage level of the drain of transistor M10 is not prevented from rising as is the case with the driver 20. Thus, the fast discharge path provided by transistors M15 and M16 causes the driver 30 to have a fast propagation delay. Furthermore, the temperature compensation circuit 34 controls the current conducted to the gate of transistor M10 to reduce the minimum rise time $t_r$ and fall time $t_f$ of the driver 30 from causing ground bouncing, output over-shooting, and large cross-talk.

A second advantage of the driver 30 is that the temperature compensation circuit 34 causes the driver's rise time $t_r$, fall time $t_f$, edge rate, turn-on delay, turn-off delay, and propagation delay to be relatively insensitive to temperature variations, supply voltage variations, and process variations.

In the embodiment shown in FIG. 5, transistor M11 has a channel width=20 μm and a channel length =1 μm, transistor M12 has a channel width=80 μm and a channel length=1 μm, transistor M13 has a channel width=160 μm and a channel length=1 μm, transistor M14 has a channel width=36 μm and a channel length=1 μm, transistor M15 has a channel width= 150 μm and a channel length=1 μm, and transistor M16 has a channel width=40 μm and a channel length=1 μm. It should be understood, however, that these channel sizes may be varied to suit the needs of a particular application.

Figure 1:
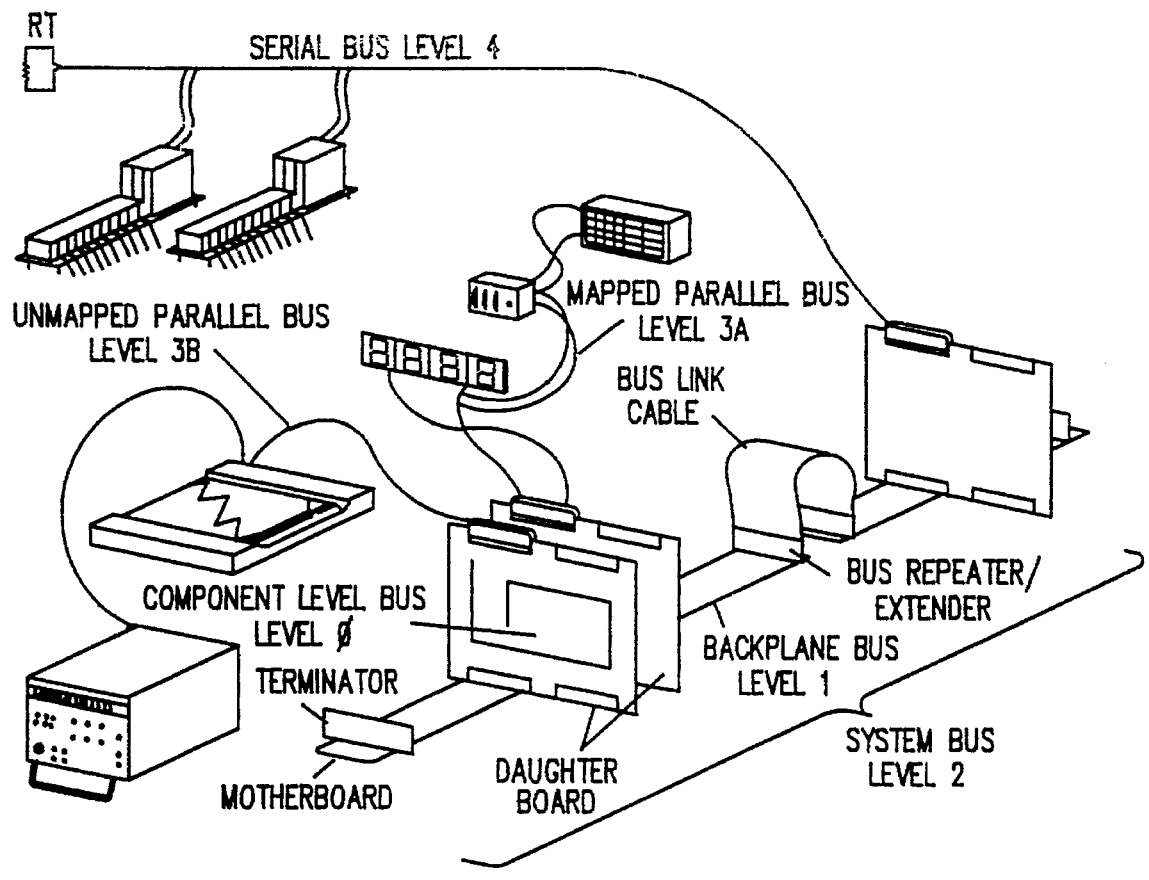
FIG. 1 is a pictorial illustration of the hierarchy of bus levels in a Futurebus+ system.
Figure 2:
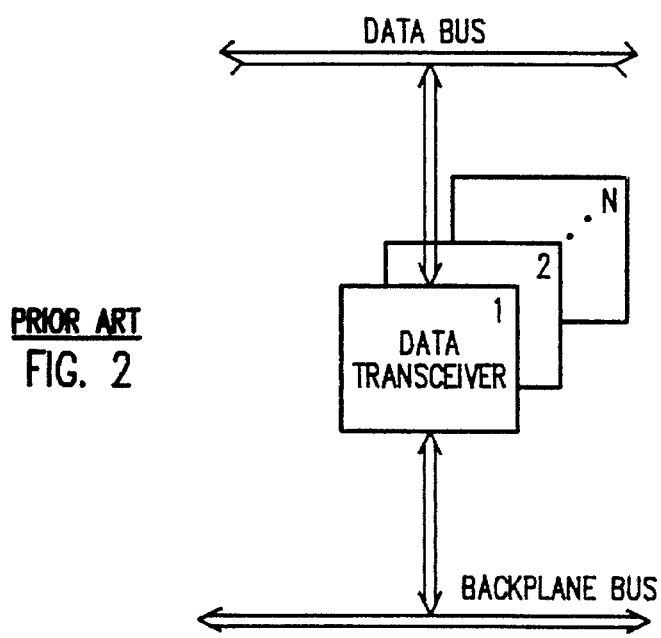
FIG. 2 is a block diagram illustrating the placement of a data transceiver between the backplane bus of a Futurebus+ system and the data bus of a processor in the Futurebus+ system.
Figure 3:
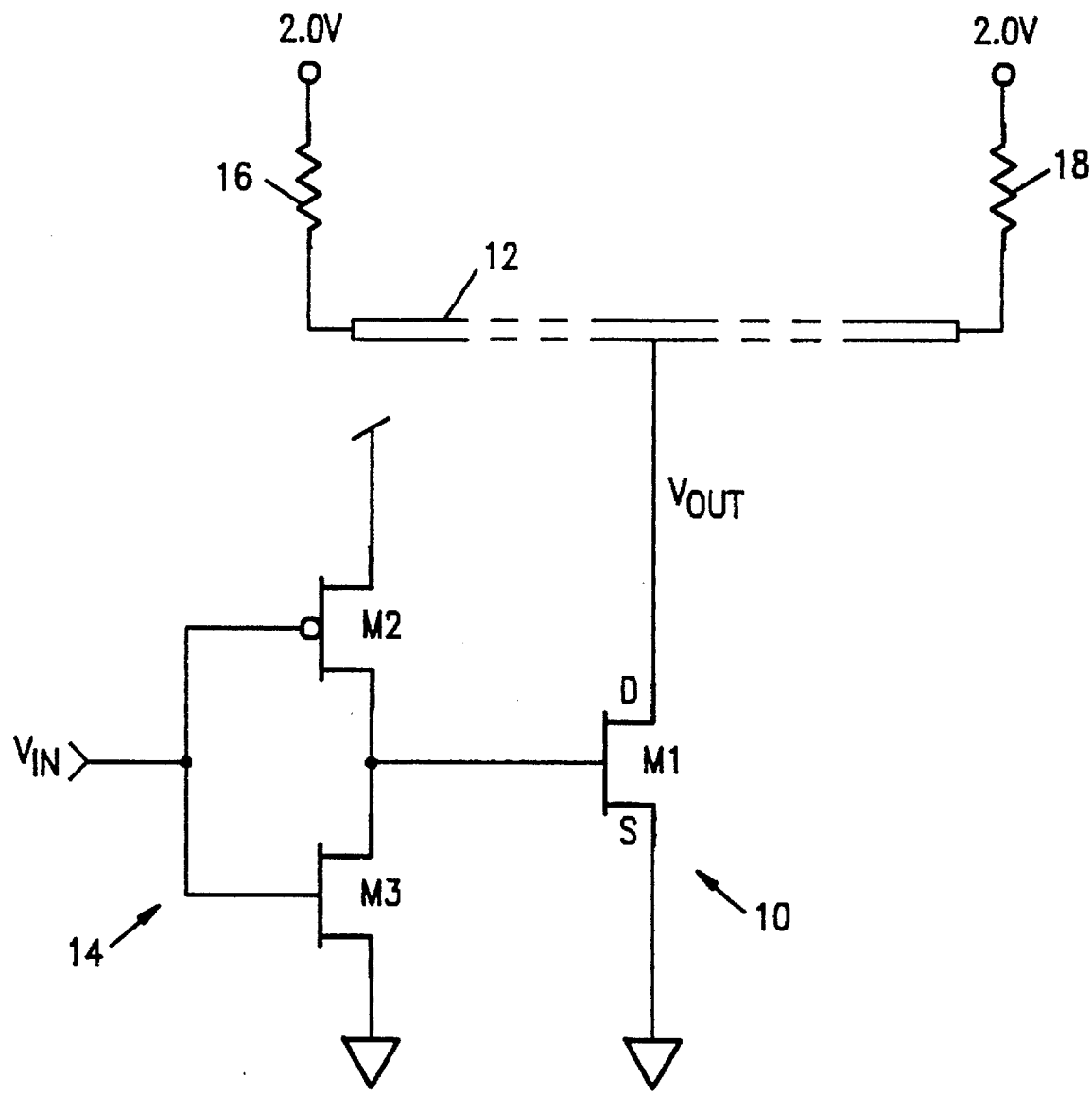
FIG. 3 is a schematic diagram illustrating a prior art GTL transmission line driver.
Figure 4:
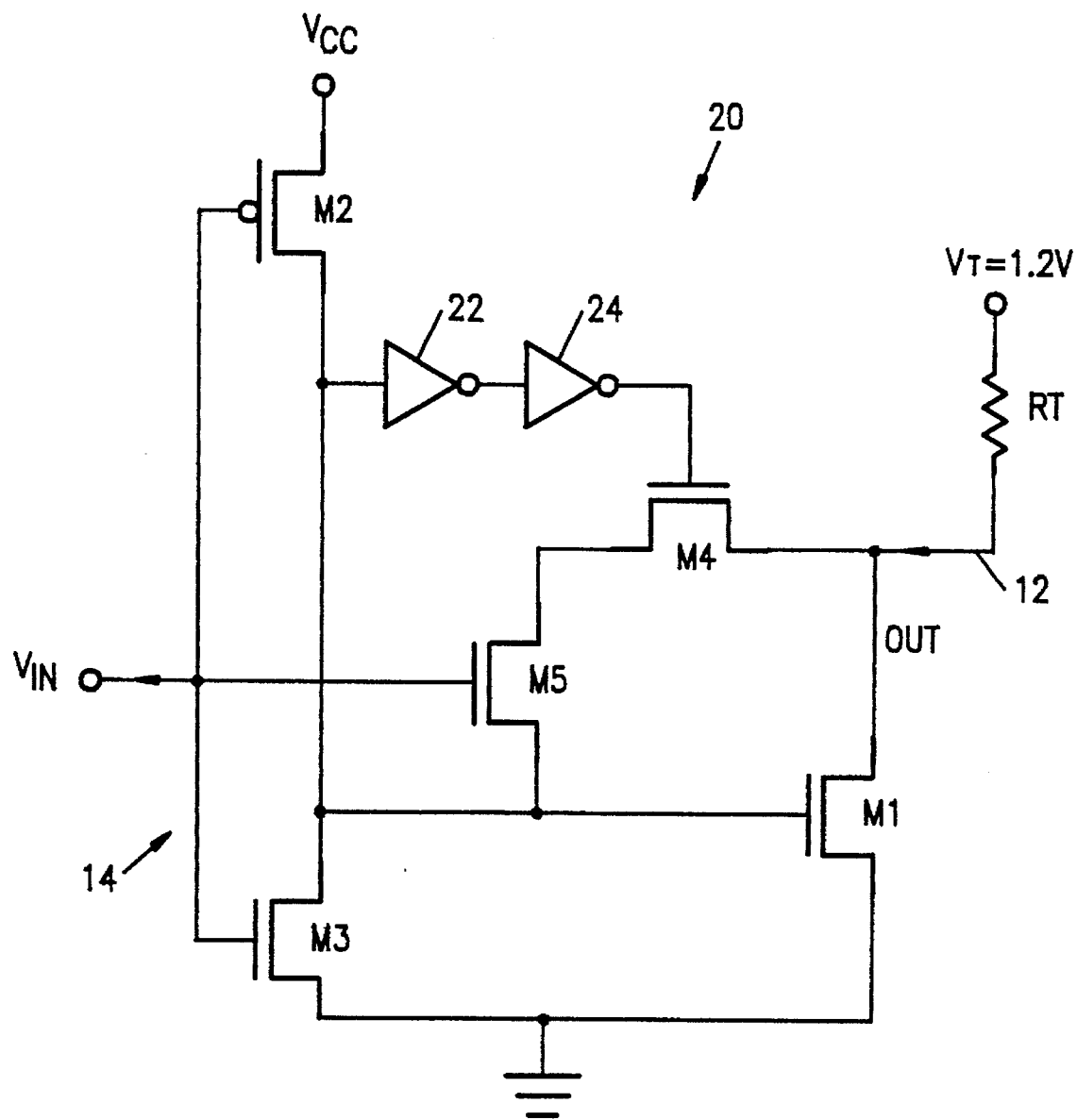
FIG. 4 is a schematic diagram illustrating the prior art GTL transmission line driver shown in FIG. 3 with a damping circuit.

The temperature compensation circuit 34, which includes the temperature adjusting circuitry 40 and the current source transistors M13 and M14, provides a means for adjusting the source-drain current $I_{SD}$ through transistor M11 and the drain-source current $I_{DS}$ through transistor M12 to compensate for temperature variations. Use of the temperature compensation circuit 34 with the driver 30 prevents the problematic variations in rise-time $t_r$ and fall time $t_f$ due to variations in temperature that plague the driver 20 shown in FIG. 4.

Temperature variations affect the performance of FETs. Temperature variations may be in the form of ambient temperature variations, i.e., variations in the temperature of the air surrounding integrated circuits, and/or junction temperature variations, i.e., variations in the temperature of the silicon in an integrated circuit. Ambient temperature variations can cause junction temperature variations, and vice versa.

FET performance is affected because temperature variations tend to cause the transconductance $g_m$ of the transistors to vary. The amount of current that is conducted by a transistor's current conducting channel, i.e., the current conducted between the drain and source ($I_{DS}$ for n-channel and $I_{SD}$ for p-channel), is determined in part by $g_m$. In the case of a MOSFET, when temperature increases, transconductance $g_m$ decreases which causes currents $I_{DS}$ and $I_{SD}$ to decrease. On the other hand, when temperature decreases, transconductance $g_m$ increases which causes $I_{DS}$ and $I_{SD}$ to increase. Thus, it may be said that the current conducted by the channel of a MOSFET has a negative temperature coefficient. Furthermore, $I_{DS}$, $I_{SD}$, and $g_m$ vary linearly with temperature variations.

Logic gates, such as the driver 30, are typically constructed from several transistors. The speed of a logic gate is determined in part by the $I_{DS}$ of the individual transistors, which results in gate speed being proportional to $g_m$. If the $g_m$ of each transistor in a logic gate varies with temperature, then the $I_{DS}$ of each transistor also varies which causes the speed of the logic gate to vary with temperature. For example, when temperature increases, gate speed decreases, and when temperature decreases, gate speed increases.

Variations in gate speed due to temperature variations is an undesirable characteristic because such variations can adversely affect the synchronized timing operations of a digital system. Digital systems can be designed to operate more efficiently if the designer can be assured that gate speed will remain constant. Gate speed can be kept relatively constant if temperature is kept constant. However, because digital systems must operate in a variety of environments, ambient and junction temperature cannot always be controlled. A relatively constant logic gate speed can be maintained during temperature variations if the current conducted by the conducting channels of a logic gate's MOSFET transistors is maintained at relatively constant levels despite the temperature variations.

Figure 6B:
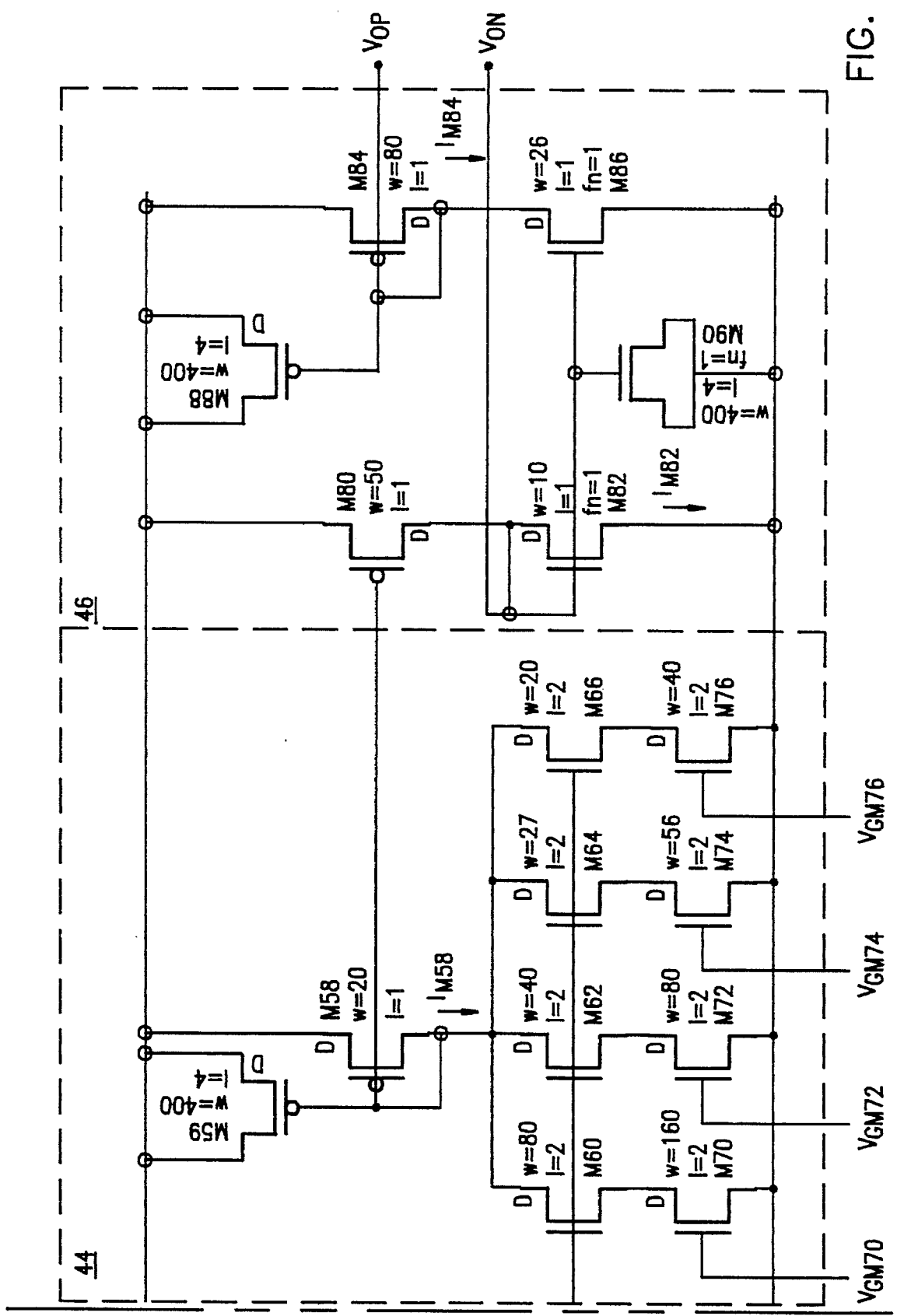
FIG. 6 is a schematic diagram illustrating a programmable CMOS temperature compensation circuit that may be used with the transmission line driver shown in FIG. 5.

FIG. 6 shows the detailed structure of the programmable CMOS temperature adjusting circuitry 40. The circuit 40 is capable of adjusting the currents $I_{DS}$ and $I_{SD}$ generated by transistors M13 and M14, respectively, to compensate for temperature variations.

In general, the circuit 40 adjusts the $I_{SD}$ generated by transistor M13 to compensate for variations in temperature by adjusting transistor M13's gate voltage in response to the temperature variations. Because transistor M13 is a p-channel MOSFET, when temperature increases, the circuit 40 adjusts the gate voltage of the transistor, via output $V_{OP}$, so that the source-gate voltage $V_{SGM13}$ increases. By increasing $V_{SGM13}$, more current $I_{SD}$ will be conducted by the transistor M13's conducting channel which will compensate for the decrease in $I_{SD}$ due to the increase in temperature. On the hand, when temperature decreases, the circuit 40 adjusts the gate voltage of transistor M13 so that the source-gate voltage $V_{SGM13}$ decreases. By decreasing $V_{SGM13}$, less current $I_{SD}$ will be conducted by the transistor's conducting channel which will compensate for the increase in $I_{SD}$ due to the decrease in temperature.

The output $V_{ON}$ is for adjusting the gate voltage of the n-channel MOSFET M14 to compensate for temperature variations. When temperature increases, $V_{ON}$ increases $V_{GSM14}$ which causes more current $I_{DS}$ to be conducted by transistor M14's conducting channel. The increase in $I_{DS}$ compensates for the decrease in $I_{DS}$ due to the increase in temperature. On the other hand, when temperature decreases, $V_{ON}$ decreases $V_{GSM14}$ which causes less current $I_{DS}$ to be conducted by the transistor's conducting channel. The decrease in $I_{DS}$ compensates for the increase in $I_{DS}$ due to the decrease in temperature.

$V_{SGM13}$ and $V_{GSM14}$ may be adjusted (via $V_{OP}$ and $V_{ON}$, respectively) so that the currents $I_{SDM13}$ and $I_{DSM14}$ are maintained at relatively constant levels during temperature variations. Preferably, however, $V_{SGM13}$ and $V_{GSM14}$ are adjusted so that the currents $I_{SDM13}$ and $I_{DSM14}$ actually increase during temperature increases and decrease during temperature decreases. In the later scenario, $V_{SGM13}$ and $V_{GSM14}$ are simply increased or decreased slightly more than they would be in the first scenario. Increasing or decreasing the currents $I_{SDM13}$ and $I_{DSM14}$ according to the later scenario tends to compensate other transistors in the driver 30 that have no direct temperature compensation system, such as transistor M1. For example, increasing the currents $I_{SDM13}$ and $I_{DSM14}$ in response to a temperature increase will tend to increase the current conducted by the other uncompensated MOSFETs in the circuit.

The adjusting circuitry 40 includes a positive temperature coefficient current generation stage 42, a programmable current transfer and modification stage 44, an output stage 46, and a start-up stage 48.

The current generation stage 42 is an important component of the circuit 40 because it generates a drain-source current $I_{M54}$ in a MOSFET that has a positive temperature coefficient. In other words, when temperature increases, $I_{M54}$ increases, and when temperature decreases, $I_{M54}$ decreases. As discussed above, the current conducted by the channel of a MOSFET normally has a negative temperature coefficient. Because $I_{M54}$ has a positive temperature coefficient, the current transfer and modification stage 44 and the output stage 46 are able to use $I_{M54}$ to generate the outputs $V_{OP}$ and $V_{ON}$ which compensates for temperature variations.

The current generation stage 42 includes an n-channel transistor M54, a monitoring circuit 80, and a current generator 82. In general, the positive temperature coefficient current $I_{M54}$ is generated as follows: The current generator 82 generates and maintains two substantially equal currents $I_{M54}$ and $I_{M56}$ that are provided to the drain of transistor M54 and the monitoring circuit 80, respectively. When the strength of one of these currents changes, the current generator 82 changes the strength of the other current so that the two currents $I_{M54}$ and $I_{M56}$ remain substantially equal. The monitoring circuit 80 monitors the potential difference between the gate and source of transistor M54 and increases the strength of $I_{M56}$ in response to an increase in temperature, and decreases the strength of IM56 in response to a decrease in temperature. Whether $I_{M56}$ is increased or decreased by the monitoring circuit 80, the current generator 82 adjusts $I_{M54}$ SO that the two currents remain substantially equal. Thus, IM54 increases when temperature increases and decreases when temperature decreases.

The monitoring circuit 80 includes an n-channel transistor M56 which has its gate coupled to the gate of transistor M54. A resistor R30 is coupled between a first node that is common with the source of transistor M54 and a second node that is common with the source of transistor M56. In the embodiment shown in FIG. 6, the first node is ground.

As indicated in FIG. 6, transistor M56 has a larger current conducting channel than the current conducting channel of transistor M54. Preferably, the channel of transistor M56 has a width of 160 µm (micro-meters) and a length of 2 µm, and the channel of transistor M54 has a width of 40 µm and a length of 2 µm. As will be discussed below, the smaller channel size of transistor M54 results in $V_{GSM54}$ being larger than $V_{GSM56}$ when the channels of transistors M54 and M56 conduct equal currents.

The current generator 82 includes two p-channel transistors M50 and M52 that have their gates coupled together. Transistor M50 has its drain coupled to the drain of transistor M54. Transistor M52 has its drain coupled to its gate and to the drain of transistor M56. The sources of transistors M50 and M52 are coupled to a common node so that the transistors function as a current mirror. In the embodiment shown in FIG. 6, the common node is a supply voltage $V_{DD}$.

As indicated in FIG. 6, transistors M50 and M52 have current conducting channels that are substantially the same size. Preferably, the channels of transistors M50 and M52 have widths of 80 µm and lengths of 2 µm. Furthermore, current $I_{M54}$ flows from the drain of transistor M50, and current $I_{M56}$ flows from the drain of transistor M52.

During operation, the equal currents $I_{M54}$ and $I_{M56}$ generated by the current generator 82 force the currents through transistors M54 and M56 to be equal. Because transistor M54 has a higher current density than transistor M56 (due to transistor M54 having a smaller conducting channel), the $V_{GS}$ of transistor M54, i.e., $V_{GSM54}$, is larger than the $V_{GS}$ of transistor M56, i.e., $V_{GSM56}$.

The drain-source current $I_{DS}$ of a MOSFET is equal to:

$$I_{DS} = \mu Co \frac{W}{L} (V_{GS} - V_{TH})^2$$

where,

W=conducting channel width;

L=conducting channel length;

$V_{TH}$=threshold voltage;

$$\mu(T) \alpha \frac{1}{T^{1.5}} ;$$

and

T=temperature

From this equation it follows that, if the $I_{DS}$ of a MOSFET is held constant, then $V_{GS}$ will increase when temperature increases, and vice versa. Thus, because the current generator 82 maintains both $I_{M54}$ and $I_{M56}$ at a relatively constant level, $V_{GSM54}$ and $V_{GSM56}$ will both increase when temperature increases and both decrease when temperature decreases. Furthermore, because transistor M54 has a higher current density than transistor M56, the $V_{GSM54}$ will increase or decrease more than the $V_{GSM56}$.

The current through resistor R30 is equal to:

$$I_{R30} = (V_{GSM54} - V_{GSM56})/R30$$

Furthermore, $$I_{R30} = I_{M56}$$

As temperature increases, $V_{GSM54}$ and $V_{GSM56}$ both increase with $V_{GSM54}$ increasing more than $V_{GSM56}$. Thus, the difference between $V_{GSM54}$ and $V_{GSM56}$ increases as temperature increases which causes $I_{R30}$, and thus, $I_{M56}$, to increase. Because transistors M50 and M52 are connected to operate as a current mirror, $I_{M54}$ remains substantially equal to $I_{M56}$. Therefore, as $I_{M56}$ increases with increasing temperature, $I_{M54}$ also increases. Conversely, as $I_{M56}$ decreases with decreasing temperature, $I_{M54}$ also decreases.

Briefly summarizing, the drain-source current $I_{DS}$ of a MOSFET normally has a negative temperature coefficient, i.e., as temperature increases, $I_{DS}$ decreases. However, the drain-source current $I_{M54}$ of transistor M54 has a positive temperature coefficient, i.e., as temperature increases, $I_{M54}$ increases. This phenomenon that occurs in the current generation stage 42 permits the other components of the circuit 40 to provide an output $V_{OP}$ to adjust the gate voltage of MOSFETs in order to compensate for variations in temperature.

It should also be noted that the positive temperature coefficient current generation stage 22 is normally not affected by variations in $V_{DD}$. Specifically, transistors M50 and M52 operate in the saturation range while conducting currents $I_{M54}$ and $I_{M56}$. If the supply voltage $V_{DD}$ changes, then the source-drain voltages $V_{SD}$ of each transistor M50 and M52 also change because the drains of transistors M54 and M56 are very high impedance. However, the currents $I_{M54}$ and $I_{M56}$ do not change because the transistors M50 and M52 are operating in saturation. Therefore, current $I_{M54}$, which has a positive temperature coefficient, is not affected by variations in $V_{DD}$, and, as will be seen, the source-drain currents conducted by transistors M13 and M14 in the driver 30 are also not affected by variations in $V_{DD}$.

It is envisioned that the n-channel transistors M54 and M56 could be replaced with p-channel transistors, and that the p-channel current generating transistors M50 and M52 could be replaced with n-channel transistors. In this scenario, p-channel transistors M54 and M56 would have different size conducting channels and have their sources coupled to $V_{DD}$, and n-channel transistors M50 and M52 would have equal size conducting channels and have their sources coupled to ground.

An n-channel transistor M57, which is optional, is used to filter out noise that may be present on the ground line. Transistor M57 is capacitor connected between ground and the gates of transistors M54 and M56, i.e., transistor M57 has its source and drain coupled to ground and its gate coupled to the gates of transistors M54 and M56.

Noise that is present on the ground line will reach the sources of transistors M54 and M56 via their connections to ground. Capacitor connected transistor M57 will let noise pass to the gates of transistors M54 and M56. Because the noise is present at both the gate and source of transistors M54 and M56, the $V_{GS}$ of each transistor should remain relatively constant.

The programmable current transfer and modification stage generates a current $I_{M58}$ that may be selectively programmed to be any one of several values that are linear proportional to current $I_{M54}$ conducted by the channel of transistor M54. This programmability allows current $I_{M54}$ to be "modified" to have a desired value, and, whatever value is selected, current $I_{M58}$ will have a positive temperature coefficient. Thus, the temperature compensation provided by outputs $V_{OP}$ and $V_{ON}$ is capable of inducing currents in transistors M13 and M14 that are a fraction or a multiple of current $I_{M54}$.

The current transfer and modification stage 44 includes four n-channel transistors M60, M62, M64, and M66 that each have a different size current conducting channel. Each of the transistors M60, M62, M64, and M66 has its gate coupled to the gate of transistor M54 and its drain coupled to the drain of transistor M58. Furthermore, each of the transistors M60, M62, M64, and M66 forms a current mirror with transistor M54; in other words, the $V_{GS}$ of transistor M54 will be substantially equal to the $V_{GS}$ of each one of the transistors M60, M62, M64, and M66.

The current transfer and modification stage 44 also includes four n-channel transistors M70, M72, M74, and M76 which respectively couple the source of each of the transistors M60, M62, M64, and M66 to ground. The purpose of transistors M70, M72, M74, and M76 is to permit current $I_{M58}$ to be selectively programmed to be conducted by the channel of only one of the transistors M60, M62, M64, and M66 at a time. The gate inputs $V_{GM70}$, $V_{GM72}$, $V_{GM74}$, and $V_{GM76}$, which switch transistors M70, M72, M74, and M76 "on" and "off", respectively, will normally be set such that only one of transistors M60, M62, M64, and M66 conducts current. Transistor M60 conducts current when transistor M70 is "on", transistor M62 conducts current when transistor M72 is "on", and so on.

In the embodiment shown in FIG. 6, transistor M60 has a channel width=80 μm and a channel length =2 μm, transistor M62 has a channel width=40 μm and a channel length=2 μm, transistor M64 has a channel width=27 μm and a channel length=2 μm, and transistor M66 has a channel width=20 μm and a channel length=2 μm. Furthermore, transistor M70 has a channel width=160 μm and a channel length=2 μm, transistor M72 has a channel width=80 μm and a channel length=2 μm, transistor M74 has a channel width=56 μm and a channel length=2 μm, and transistor M76 has a channel width=40 μm and a channel length=2 μm.

Current $I_{M58}$ will vary according to the "on/off" status of transistors M70, M72, M74, and M76 because these transistors determine which one of the transistors M60, M62, M64, and M66, which all have different channel sizes, will conduct current $I_{M58}$. Current $I_{M58}$ can be made equal to a fraction or a multiple of $I_{M54}$ by adjusting the channel size of the transistor which conducts $I_{M58}$. For example, when $I_{M58}$ is conducted through transistor M60, $I_{M58}$ will be twice as large as $I_{M54}$ because transistor M60's channel is twice as large as transistor M54's channel; when $I_{M58}$ is conducted through transistor M62, $I_{M58}$ will be equal to $I_{M54}$ because transistor M62's channel is the same size as transistor M54's channel. Thus:

$$
\begin{aligned}
I_{M58} &= 2\,I_{M54} &\text{when } M70 \text{ is ON} \\
&= 1\,I_{M54} &\text{when } M72 \text{ is ON} \\
&= 0.67\,I_{M54} &\text{when } M74 \text{ is ON} \\
&= 0.5\,I_{M54} &\text{when } M76 \text{ is ON}
\end{aligned}
$$

By selectively programming the inputs $V_{GM70}$, $V_{GM72}$, $V_{GM74}$, and $V_{GM76}$, current $I_{M54}$ is "transferred" to current $I_{M58}$ and "modified" to be a fraction or multiple of $I_{M54}$. The inputs $V_{GM70}$, $V_{GM72}$, $V_{GM74}$, and $V_{GM76}$ are controlled by logic circuitry which will be discussed below with reference to FIGS. 7A and 7B.

It should be noted that, because transistors M70, M72, M74, and M76 each have a channel size that is twice as large as their respective transistors M60, M62, M64, and M66, the presence of transistors M70, M72, M74, and M76 does not significantly affect the current mirror relationship between transistor M54 and transistors M60, M62, M64, and M66.

Using the mirror effect and adjusting the channel size of transistor M62 may seem like a complex way to modify $I_{M54}$ because $I_{M54}$ can also be modified by adjusting the value of resistor R30. However, the temperature coefficient of $I_{M56}$ varies with its current level which is a function of the value of R30 and the channel width and length of transistors M54 and M56. Therefore, it is not desirable to adjust $I_{M54}$ by varying R30 because such variation will also change $I_{M54}$'s temperature coefficient.

The transfer and modification stage 44 also includes an optional capacitor connected p-channel transistor M59 that is coupled between $V_{DD}$ and the gate of transistor M58 in order to filter out noise that may be present in the $V_{DD}$ line. Specifically, transistor M59's source and drain are coupled to $V_{DD}$ and its gate is coupled to the gate of transistor M58.

The output stage 46 is coupled to the gate of transistor M58. The purpose of the output stage 46 is to generate two currents, $I_{M82}$ and $I_{M84}$, that are linearly proportional to current $I_{M58}$. Current $I_{M82}$ is used to generate output voltage $V_{ON}$ for application to the gates of n-channel MOSFETs to compensate for variations in temperature, and current $I_{M84}$ is used to generate output voltage $V_{OP}$ for application to the gates of p-channel MOSFETs to compensate for variations in temperature.

A p-channel transistor M80 has its source coupled to $V_{DD}$, its gate coupled to the gate of transistor M58, and its drain coupled to the drain of an n-channel transistor M82. Transistor M82 has its gate is coupled to its drain and its source coupled to ground. The channels of transistors M80 and M82 conduct current $I_{M82}$, and the gate of transistor M82 provides output $V_{ON}$.

Transistor M80 forms a current mirror with transistor M58; thus, the $V_{GS}$ of the two transistors will be substantially equal. Current $I_{M82}$ will be linear proportional to current $I_{M58}$ and have a positive temperature coefficient. The value of $I_{M82}$ will depend on the channel size of transistor M80. In the embodiment shown in FIG. 6, transistor M80 has a channel width=50 μm and a channel length=1 μm, and transistor M82 has a channel width=10 μm and a channel length=1 μm. Because transistor M80 has a larger channel than transistor M58, current $I_{M82}$ will be larger than current $I_{M58}$. It should be understood, however, that by adjusting the channel size of transistor M80, the strength of $I_{M82}$ can be adjusted, and by adjusting the channel size of transistor M82, the output voltage $V_{ON}$, which is equal to $V_{GSM82}$, can be adjusted.

By connecting output $V_{ON}$ to the gate of n-channel transistor M4, a current mirror is formed between transistor M82 and transistor M4. Thus, the current conducted by the channel of transistor M4 will be linear proportional to $I_{M82}$ and have a positive temperature coefficient.

A p-channel transistor M84 has its source coupled to $V_{DD}$, its gate coupled to its drain, and its drain coupled to the drain of an n-channel transistor M86. Transistor M86 has its source coupled to ground and its gate coupled to the gate of transistor M82. The channels of transistors M84 and M86 conduct current $I_{M84}$, and the gate of transistor M84 provides output $V_{OP}$.

Transistor M86 forms a current mirror with transistor M82; thus, the $V_{GS}$ of the two transistors will be substantially equal. Current $I_{M84}$ will be linear proportional to currents $I_{M82}$ and $I_{M58}$, and have a positive temperature coefficient. The value of $I_{M84}$ will depend on the channel size of transistor M86. In the embodiment shown in FIG. 6, transistor M86 has a channel width=26 μm and a channel length =1 μm, and transistor M84 has a channel width=80 μm and a channel length=1 μm. Because transistor M86 has a larger channel than transistor M82, current $I_{M84}$ will be larger than current $I_{M82}$. It should be understood, however, that by adjusting the channel size of transistor M86, the strength of $I_{M84}$ can be adjusted, and by adjusting the channel size of transistor M84, the output voltage $V_{OP}$, which is equal to $V_{SGM84}$, can be adjusted.

By connecting output $V_{OP}$ to the gate of p-channel transistor M13, a current mirror is formed between transistor M84 and transistor M13. Thus, the current conducted by the channel of transistor M13 will be linear proportional to $I_{M84}$ and have a positive temperature coefficient.

Optional capacitor connected p-channel transistor M88 and n-channel transistor M90 filter noise that may be present on the $V_{DD}$ and ground lines, respectively. Transistor M88 has its source and drain coupled to $V_{DD}$ and its gate coupled to the gate of transistor M84. Transistor M90 has its source and drain coupled to ground and its gate coupled to the gates of transistors M82 and M86.

The purpose of the start-up stage 48 is to feed current to transistor M54 when the voltage supply $V_{DD}$ initially starts from ground level so that transistor M54's conducting channel can begin to conduct current.

An n-channel transistor M94 has its drain coupled to $V_{DD}$ and its source coupled to the drain of transistor M54. A diode connected p-channel transistor M92 is coupled between $V_{DD}$ and the gate of transistor M94, and two diode connected n-channel transistors M96 and M98 couple the gate of transistor M94 to ground. In the embodiment shown in FIG. 6, transistor M94 has a channel width=5 μm and a channel length=2 μm, transistor M92 has a channel width=3 μm and a channel length=100 μm, and transistors M96 and M98 have channel widths=60 μm and channel lengths=2 μm. The channel sizes of transistors M92, M94, M96, and M98 may be varied to suit the needs of a particular application.

When voltage supply $V_{DD}$ initially starts from ground level, none of the transistors carry current. When $V_{DD}$ rises above three times the threshold voltage, i.e., 3 $V_{TH}$, of transistor M94, transistor M94 feeds current into the drain of transistor M54. As the channel of transistor M54 begins to conduct current, a voltage drop is induced across the gate and source of transistor M56. Transistor M56 begins to conduct current which causes transistor M52 to begin to conduct current. Due to the current mirror action, transistor M50 also begins to conduct current which feeds back to transistor M54. This positive feedback continues until the current conducted by transistor M56 reaches its final value. Because the gate of transistor M94 is clamped by diode connected transistors M96 and M98, the rise of the drain potential of transistor M54 eventually shuts off transistor M94.

Figures 7A, 7B:
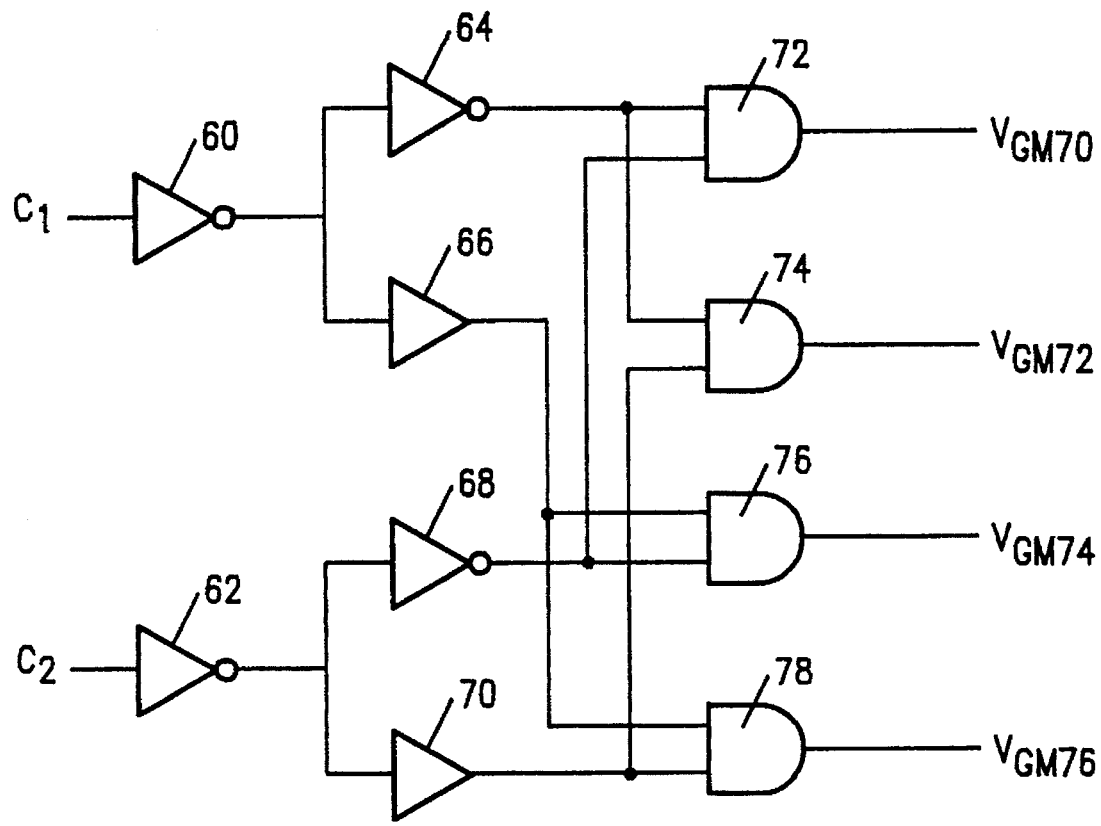
FIG. 7A is a schematic diagram illustrating control logic circuitry that may be used for programming the temperature compensation circuit shown in FIG. 6.
FIG. 7B is a truth table for the control logic circuitry shown in FIG. 7A.

FIG. 7A shows the control logic circuitry for programming transistors M70, M72, M74, and M76 so that only one of transistors M60, M62, M64, and M66 conducts current $I_{M58}$ at a time. The control logic includes two inverters 60 and 62 that receive at their inputs control signals C1 and C2, respectively. The output of inverter 60 is coupled to the input of an inverter 64 and the input of a buffer 66, and the output of inverter 62 is coupled to the input of an inverter 68 and the input of a buffer 70.

Four AND gates 72, 74, 76, and 78 receive the outputs of inverters 64 and 68 and buffers 66 and 70. Specifically, AND gate 72 receives the outputs of inverters 64 and 68, AND gate 74 receives the outputs of inverter 64 and buffer 70, AND gate 76 receives the outputs of buffer 66 and inverter 68, and AND gate 78 receives the outputs of buffers 66 and 70. AND gates 72, 74, 76, and 78 have their outputs $V_{GM70}$, $V_{GM72}$, $V_{GM74}$, and $V_{GM76}$ coupled to the gates of transistors M70, M72, M74, and M76, respectively.

FIG. 7B shows a truth table for the logic circuit of FIG. 7A. For each combination of control signals C1 and C2, only one of the outputs $V_{GM70}$, $V_{GM72}$, $V_{GM74}$, and $V_{GM76}$ will be logic "1" at a time.

It should be understood that the programmability feature of the current transfer and modification stage 44 that is implemented by the use of the several transistors M60, M62, M64, M66, M70, M72, M74, and M76, as well as the control logic circuitry shown in FIG. 7A, is optional. Current $I_{M54}$ may be modified, i.e., amplified, by simply substituting for transistors M60, M62, M64, and M66 various transistors that have various different channel sizes.

In addition, it should be well understood that the specific channel sizes of the MOSFETs shown in FIGS. 5 through 8 and recited herein may be adjusted to achieve various different amplifications of the generated currents and voltages without deviating from the spirit of the present invention.

The rise time $t_r$, fall time $t_f$, edge rate, turn-on delay, turn-off delay, and propagation delay of the prior art driver 20 discussed above are sensitive to temperature and voltage supply VDD variations because the current levels conducted by transistors M2 and M3 vary with such temperature and supply variations. The levels of current conducted by transistors M2 and M3 directly relate to the driver 20's rise time $t_r$, fall time $t_f$, etc. However, the temperature compensation circuit 34 of the present invention causes the currents conducted by transistors M11 and M12 (via transistors M13 and M14) of the diver 30 to be compensated for such temperature variations. Furthermore, as discussed above, the temperature compensation circuit 34 also causes the currents conducted by transistors M13 and M14 (and thus, transistors M11 and M12) to not be affected by variations in $V_{DD}$. Thus, the rise time $t_r$, fall time $t_f$, edge rate, turn-on delay, turn-off delay, and propagation delay of the driver 30 are relatively insensitive to temperature and voltage supply VDD variations.

The temperature compensation circuit 34 also causes the driver 30's rise time $t_r$, fall time $t_f$, edge rate, turn-on delay, turn-off delay, and propagation delay to be relatively insensitive to process variations because the current conducted by transistors M11 and M12 is set, and can be adjusted by, the temperature compensation circuit 34.

Because the improvements in the rise time $t_r$, fall time $t_f$, edge rate, turn-on delay, turn-off delay, and propagation delay due to the temperature compensation circuit 34 and the discharge circuit 36, the driver 30 has low output pulse distortion and may be operated at a data rate up to 250 MHz.

Figure 8A:
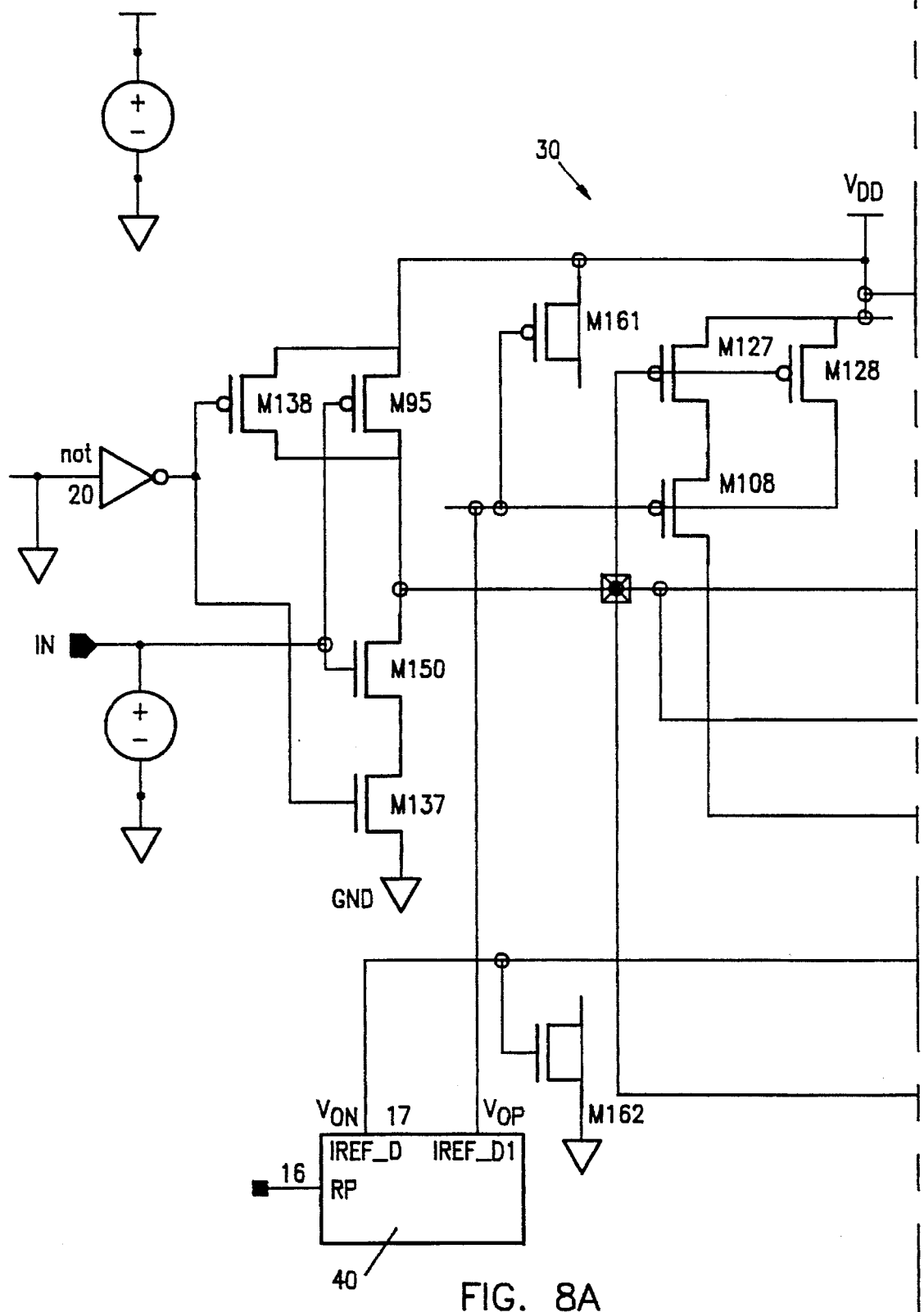
FIG. 8 is a detailed schematic diagram illustrating the CMOS transmission line driver shown in FIG. 5.
Figure 8B:
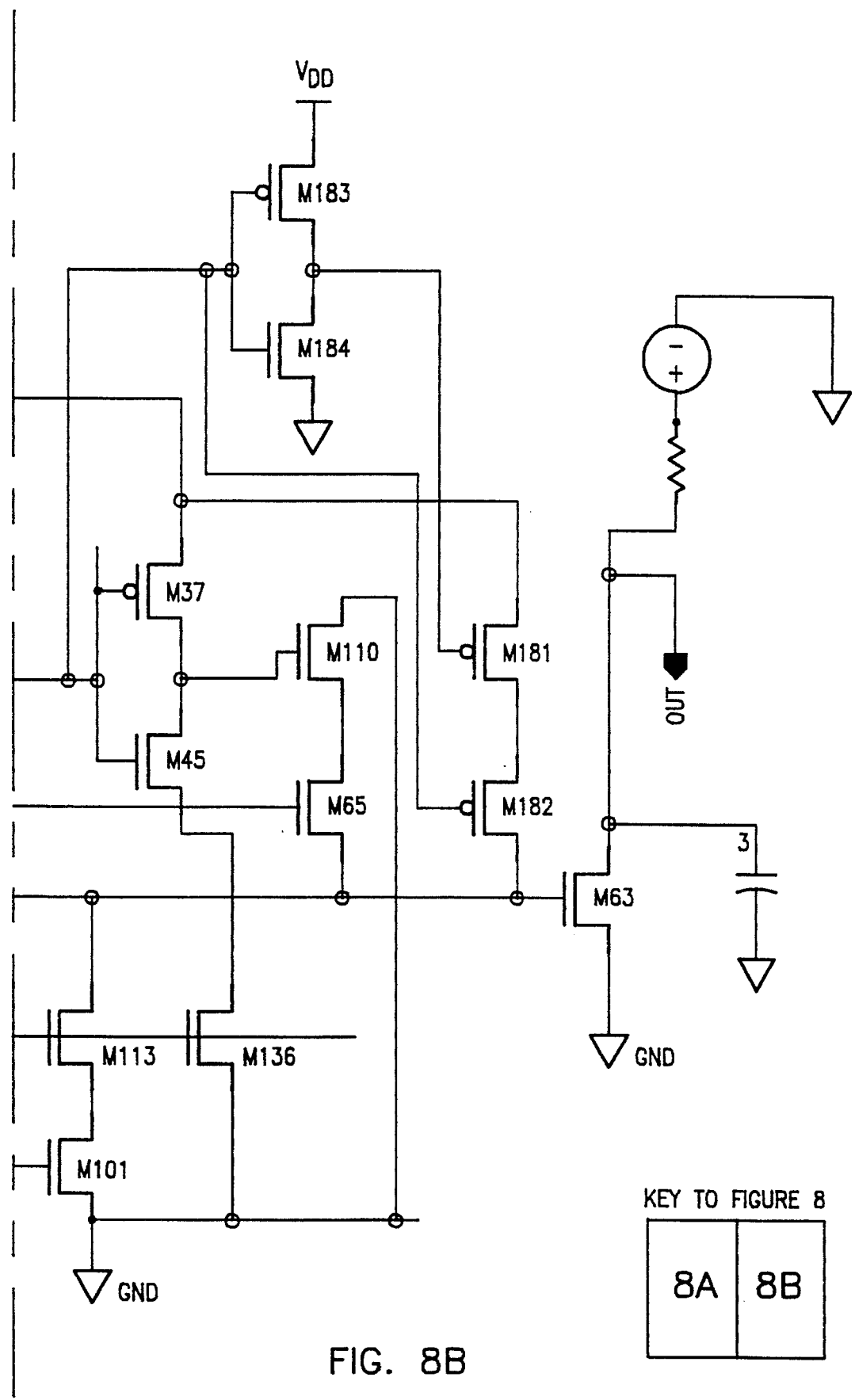

FIG. 8 shows a more detailed schematic of the driver 30. In this figure it is seen that inverter 37 is made up of a p-channel transistor M55 and an n-channel transistor M45, and that inverter 38 is made up of a p-channel transistor M93 and an n-channel transistor M95. Furthermore, inverter 37 is grounded through an n-channel transistor M136. The gate of transistor M136 is coupled to output VON of the temperature adjusting circuitry 40. An additional p-channel transistor M128 forms a current mirror with transistor M11. The drain of transistor M128 is coupled to the gate of transistor M13. FIG. 8 also shows the channel sizes for all of the transistors.

Although the embodiment of the present invention shown in FIGS. 5 through 8 utilizes MOSFETs, it is envisioned that the present invention may also be used in connection with other technologies, such as junction FETs (JFETs) or Gallium Arsenide (GaAs).

It should be understood that various alternatives to the embodiments of the invention described herein may be employed in practicing the invention. It is intended that the following claims define the scope of the invention and that structures and methods within the scope of these claims and their equivalents be covered thereby.

What is claimed is:

1. A driver for providing binary signals from a data system to a transmission line, the driver comprising:

a first n-channel transistor having its drain coupled to the transmission line and its source coupled to ground, the channel of the first n-channel transistor having a width that is greater than its length;

a first inverter stage for conducting current from a first voltage supply to the gate of the first n-channel transistor in order to switch the first n-channel transistor into a conductive state and for conducting current from the gate of the first n-channel transistor to ground in order to switch the first n-channel transistor into a non-conductive state;

a discharge circuit for providing a discharge path from the gate of the first n-channel transistor to ground during a discharge time period and then removing the discharge path at the end of the discharge time period, the discharge time period beginning when the first inverter stage receives a binary signal commanding it to switch the first n-channel transistor from the conductive state to the non-conductive state, and the discharge time period having a length equal to a period of time necessary to decrease the gate-source voltage of the first n-channel transistor to a level just above its threshold voltage, the discharge circuit including first and second series connected field effect transistors (FET) coupled between the gate of the first n-channel transistor and ground that are switched into simultaneous conducting states for a length of time approximately equal to the discharge time period to provide the discharge path; and a temperature compensation circuit coupled to the first inverter stage for adjusting the level of current conducted to the gate of the first n-channel transistor and the level of current conducted from the gate of the first n-channel transistor to compensate for variations in temperature, wherein the temperature compensation circuit includes a positive temperature coefficient current generation circuit having a third FET having a gate coupled to a gate of a fourth FET having a larger current conducting channel than a current conducting channel in the third FET in order to generate a current that increases in response to an increase in temperature.

2. A driver according to claim 1, wherein the discharge time period is approximately equal to a one logic gate delay time.

3. A driver for providing binary signals from a data system to a transmission line, the driver comprising:

a first n-channel transistor having its drain coupled to the transmission line and its source coupled to ground, the channel of the first n-channel transistor having a width that is greater than its length;

a first inverter stage for conducting current from a first voltage supply to the gate of the first n-channel transistor in order to switch the first n-channel transistor into a conductive state and for conducting current from the gate of the first n-channel transistor to ground in order to switch the first n-channel transistor into a non-conductive state;

a discharge circuit for providing a discharge path from the gate of the first n-channel transistor to ground during a discharge time period and then removing the discharge path at the end of the discharge time period, the discharge time period beginning when the first inverter stage receives a binary signal commanding it to switch the first n-channel transistor from the conductive state to the non-conductive state, and the discharge time period having a length equal to a period of time necessary to decrease the gate-source voltage of the first n-channel transistor to a level just above its threshold voltage; and a temperature compensation circuit coupled to the first inverter stage for adjusting the level of current conducted to the gate of the first n-channel transistor and the level of current conducted from the gate of the first n-channel transistor to compensate for variations in temperature, wherein the temperature compensation circuit includes a positive temperature coefficient current generation circuit which generates a current that increases in response to an increase in temperature;

wherein the discharge circuit includes, second and third series connected n-channel transistors coupled between the gate of the first n-channel transistor and ground to provide a discharge path from the gate of the first n-channel transistor to ground; and switching means for switching the second and third n-channel transistors into simultaneous conducting states for a length of time approximately equal to the discharge time period.

4. A driver according to claim 3, wherein the switching means comprises:

a second inverter coupled between the input of the first inverter stage and the gate of the second n-channel transistor, the second inverter having a delay time period;

wherein the input of the first inverter stage is coupled to the gate of the third n-channel transistor; and wherein the discharge time period is approximately equal to the delay time period of the second inverter.

5. A driver for providing binary signals from a data system to a transmission line, the driver comprising:

a first n-channel transistor having its drain coupled to the transmission line and its source coupled to ground, the channel of the first n-channel transistor having a width that is greater than its length;

a first inverter stage for conducting current from a first voltage supply to the gate of the first n-channel transistor in order to switch the first n-channel transistor into a conductive state and for conducting current from the gate of the first n-channel transistor to ground in order to switch the first n-channel transistor into a non-conductive state;

a temperature compensation circuit coupled to the first inverter stage for adjusting the level of current conducted to the gate of the first n-channel transistor and the level of current conducted from the gate of the first n-channel transistor to compensate for variations in temperature, wherein the temperature compensation circuit includes a positive temperature coefficient current generation circuit having a first field effect transistor (FET) having a gate coupled to a gate of a second FET having a larger current conducting channel than a current conducting channel in the first FET in order to generate a current that increases in response to an increase in temperature; and a discharge circuit for providing a discharge path from the gate of the first n-channel transistor to ground during a discharge time period, the discharge circuit including third and fourth series connected FETs coupled between the gate of the first n-channel transistor and ground that are switched into simultaneous conducting states for a length of time approximately equal to the discharge time period to provide the discharge path.

6. A driver for providing binary signals from a data system to a transmission line, the driver comprising:

a first n-channel transistor having its drain coupled to the transmission line and its source coupled to ground, the channel of the first n-channel transistor having a width that is greater than its length;

a first inverter stage for conducting current from a first voltage supply to the gate of the first n-channel transistor in order to switch the first n-channel transistor into a conductive state and for conducting current from the gate of the first n-channel transistor to ground in order to switch the first n-channel transistor into a non-conductive state; and a temperature compensation circuit coupled to the first inverter stage for adjusting the level of current conducted to the gate of the first n-channel transistor and the level of current conducted from the gate of the first n-channel transistor to compensate for variations in temperature, wherein the temperature compensation circuit includes a positive temperature coefficient current generation circuit which generates a current that increases in response to an increase in temperature;

wherein the temperature compensation circuit further includes, a fourth p-channel transistor having its drain coupled to the gate of the first n-channel transistor; and a fifth n-channel transistor having its drain coupled to the gate of the first n-channel transistor;

wherein the positive temperature coefficient current generation circuit adjusts the gate voltages of the fourth and fifth transistors to compensate for variations in temperature.

7. A driver for providing binary signals from a data system to a transmission line, the driver comprising:

a first n-channel transistor having its drain coupled to the transmission line and its source coupled to ground, the channel of the first n-channel transistor having a width that is greater than its length;

a first inverter stage for conducting current from a first voltage supply to the gate of the first n-channel transistor in order to switch the first n-channel transistor into a conductive state and for conducting current from the gate of the first n-channel transistor to ground in order to switch the first n-channel transistor into a non-conductive state; and a temperature compensation circuit coupled to the first inverter stage for adjusting the level of current conducted to the gate of the first n-channel transistor and the level of current conducted from the gate of the first n-channel transistor to compensate for variations in temperature;

wherein the temperature compensation circuit includes, a first p-channel transistor having its drain coupled to the gate of the first n-channel transistor;

a second n-channel transistor having its drain coupled to the gate of the first n-channel transistor; and a positive temperature coefficient current generation circuit for adjusting the gate voltages of the first p-channel and the second n-channel transistors to compensate for variations in temperature;

wherein the positive temperature coefficient current generation circuit includes, a first field-effect transistor (FET);

a second FET having a larger current conducting channel than the current conducting channel of the first FET, the second FET having its gate coupled to the gate of the first FET;

a first resistor coupled between a first node that is common with the source of the first FET and a second node that is common with the source of the second FET; and current generating circuitry for generating and maintaining substantially equal drain currents in the first and second FETs.

8. A driver for providing binary signals from a data system to a transmission line, the driver comprising:

a first n-channel transistor having its drain coupled to the transmission line and its source coupled to ground, the channel of the first n-channel transistor having a width that is greater than its length;

a first inverter stage for conducting current from a first voltage supply to the gate of the first n-channel transistor in order to switch the first n-channel transistor into a conductive state and for conducting current from the gate of the first n-channel transistor to ground in order to switch the first n-channel transistor into a non-conductive state;

a temperature compensation circuit coupled to the first inverter stage for adjusting the level of current conducted to the gate of the first n-channel transistor and the level of current conducted from the gate of the first n-channel transistor to compensate for variations in temperature, wherein the temperature compensation circuit includes a positive temperature coefficient current generation circuit which generates a current that increases in response to an increase in temperature; and a discharge circuit for providing a discharge path from the gate of the first n-channel transistor to ground during a discharge time period and then removing the discharge path at the end of the discharge time period, the discharge time period beginning when the first inverter stage receives a binary signal commanding it to switch the first n-channel transistor from the conductive state to the non-conductive state, and the discharge time period having a length equal to a period of time necessary to decrease the gate-source voltage of the first n-channel transistor to a level just above its threshold voltage.

9. A driver for providing binary signals from a data system to a transmission line that has its ends terminated in its characteristic impedance, the driver comprising:

a first n-channel transistor having its drain coupled to the transmission line and its source coupled to ground, the channel of the first n-channel transistor having a width that is plural orders of magnitude greater than its length;

a first inverter stage for conducting current from a first voltage supply to the gate of the first n-channel transistor in order to switch the first n-channel transistor into a conductive state and for conducting current from the gate of the first n-channel transistor to ground in order to switch the first n-channel transistor into a non-conductive state;

a discharge circuit for providing a discharge path from the gate of the first n-channel transistor to ground during an approximately one logic gate delay time period that begins when the first inverter stage receives a binary signal commanding it to switch the first n-channel transistor from the conductive state to the non-conductive state, the discharge circuit including first and second series connected field effect transistors (FET) coupled between the gate of the first n-channel transistor and ground that are switched into simultaneous conducting states for a length of time approximately equal to the one logic gate delay time period to provide the discharge path; and a temperature compensation circuit coupled to the first inverter stage for adjusting the level of current conducted to the gate of the first n-channel transistor and the level of current conducted from the gate of the first n-channel transistor to compensate for variations in temperature, wherein the temperature compensation circuit includes a positive temperature coefficient current generation circuit having a third FET having a gate coupled to a gate of a fourth FET having a larger current conducting channel than a current conducting channel in the third FET in order to generate a current that increases in response to an increase in temperature.

10. A driver for providing binary signals from a data system to a transmission line that has its ends terminated in its characteristic impedance, the driver comprising:

a first n-channel transistor having its drain coupled to the transmission line and its source coupled to ground, the channel of the first n-channel transistor having a width that is plural orders of magnitude greater than its length;

a first inverter stage for conducting current from a first voltage supply to the gate of the first n-channel transistor in order to switch the first n-channel transistor into a conductive state and for conducting current from the gate of the first n-channel transistor to ground in order to switch the first n-channel transistor into a non-conductive state;

a discharge circuit for providing a discharge path from the gate of the first n-channel transistor to ground during an approximately one logic gate delay time period that begins when the first inverter stage receives a binary signal commanding it to switch the first n-channel transistor from the conductive state to the non-conductive state; and a temperature compensation circuit coupled to the first inverter stage for adjusting the level of current conducted to the gate of the first n-channel transistor and the level of current conducted from the gate of the first n-channel transistor to compensate for variations in temperature, wherein the temperature compensation circuit includes a positive temperature coefficient current generation circuit which generates a current that increases in response to an increase in temperature;

wherein the discharge circuit includes, second and third series connected n-channel transistors coupled between the gate of the first n-channel transistor and ground to provide a discharge path from the gate of the first n-channel transistor to ground; and switching means for switching the second and third n-channel transistors into simultaneous conducting states for approximately one logic gate delay time period.

11. A driver according to claim 10, wherein the switching means comprises:

a second inverter coupled between the input of the first inverter stage and the gate of the second n-channel transistor; and wherein the input of the first inverter stage is coupled to the gate of the third n-channel transistor.

12. A driver for providing binary signals from a data system to a transmission line that has its ends terminated in its characteristic impedance, the driver comprising:

a first n-channel transistor having its drain coupled to the transmission line and its source coupled to ground, the channel of the first n-channel transistor having a width that is plural orders of magnitude greater than its length;

a first inverter stage for conducting current from a first voltage supply to the gate of the first n-channel transistor in order to switch the first n-channel transistor into a conductive state and for conducting current from the gate of the first n-channel transistor to ground in order to switch the first n-channel transistor into a non-conductive state;

a discharge circuit for providing a discharge path from the gate of the first n-channel transistor to ground during an approximately one logic gate delay time period that begins when the first inverter stage receives a binary signal commanding it to switch the first n-channel transistor from the conductive state to the non-conductive state; and a temperature compensation circuit coupled to the first inverter stage for adjusting the level of current conducted to the gate of the first n-channel transistor and the level of current conducted from the gate of the first n-channel transistor to compensate for variations in temperature, wherein the temperature compensation circuit includes a positive temperature coefficient current generation circuit which generates a current that increases in response to an increase in temperature;

wherein the temperature compensation circuit further includes, a first p-channel transistor having its drain coupled to the gate of the first n-channel transistor; and a second n-channel transistor having its drain coupled to the gate of the first n-channel transistor;

wherein the positive temperature coefficient current generation circuit adjusts the gate voltages of the first p-channel and second n-channel transistors to compensate for variations in temperature.

13. A driver for providing binary signals from a data system to a transmission line that has its ends terminated in its characteristic impedance, the driver comprising:

a first n-channel transistor having its drain coupled to the transmission line and its source coupled to ground, the channel of the first n-channel transistor having a width that is plural orders of magnitude greater than its length;

a first inverter stage for conducting current from a first voltage supply to the gate of the first n-channel transistor in order to switch the first n-channel transistor into a conductive state and for conducting current from the gate of the first n-channel transistor to ground in order to switch the first n-channel transistor into a non-conductive state;

a discharge circuit for providing a discharge path from the gate of the first n-channel transistor to ground during an approximately one logic gate delay time period that begins when the first inverter stage receives a binary signal commanding it to switch the first n-channel transistor from the conductive state to the non-conductive state; and a temperature compensation circuit coupled to the first inverter stage for adjusting the level of current conducted to the gate of the first n-channel transistor and the level of current conducted from the gate of the first n-channel transistor to compensate for variations in temperature;

wherein the temperature compensation circuit includes, a first p-channel transistor having its drain coupled to the gate of the first n-channel transistor;

a second n-channel transistor having its drain coupled to the gate of the first n-channel transistor; and a positive temperature coefficient current generation circuit for adjusting the gate voltages of the first p-channel and second n-channel transistors to compensate for variations in temperature;

wherein the positive temperature coefficient current generation circuit includes, a first field-effect transistor (FET);

a second FET having a larger current conducting channel than the current conducting channel of the first FET, the second FET having its gate coupled to the gate of the first FET;

a first resistor coupled between a first node that is common with the source of the first FET and a second node that is common with the source of the second FET; and current generating circuitry for generating and maintaining substantially equal drain currents in the first and second FETs.

* * * * *